US006822866B2

(12) United States Patent
Fearing et al.

(10) Patent No.: US 6,822,866 B2
(45) Date of Patent: Nov. 23, 2004

(54) MICRODRIVE

(75) Inventors: Oliver Fearing, Huntington, WV (US); Geraldo Nojima, Duluth, GA (US); Lyle T. Keister, Bishop, GA (US)

(73) Assignee: SMC Electrical Products Inc., Huntington, WV (US)

( * ) Notice: Subject to any disclaimer, the term of this patent is extended or adjusted under 35 U.S.C. 154(b) by 296 days.

(21) Appl. No.: 09/985,382

(22) Filed: Nov. 2, 2001

(65) Prior Publication Data

US 2004/0012983 A1 Jan. 22, 2004

Related U.S. Application Data

(60) Provisional application No. 60/245,158, filed on Nov. 3, 2000.

(51) Int. Cl.[7] .................................................. H05K 7/20
(52) U.S. Cl. ....................... 361/701; 361/699; 361/705; 361/709; 363/131; 363/132; 363/144; 174/256; 257/714; 165/286
(58) Field of Search .......................... 361/22, 306, 535, 361/699–719, 678; 363/27, 45, 65, 141, 144, 131, 132, 41, 71; 174/16.1, 16.3, 256, 262; 165/286, 80.4, 185, 274, 101, 104.33, 104.34, 104.21–104.27, 240, 246; 700/12; 257/714–718, 916; 62/99, 113, 176, 129, 180, 158, 176.6

(56) References Cited

U.S. PATENT DOCUMENTS

| 3,840,783 A | 10/1974 | Eckart |
| 4,242,718 A | 12/1980 | Shariff et al. |
| 4,458,305 A | 7/1984 | Buckle et al. |
| 4,492,975 A | 1/1985 | Yamada et al. |
| 4,815,985 A | 3/1989 | Chapotier |
| 4,894,763 A | 1/1990 | Ngo |
| 5,045,988 A | 9/1991 | Gritter et al. |
| 5,184,280 A | 2/1993 | Fouad |
| 5,184,291 A | * 2/1993 | Crowe et al. ................ 363/37 |
| 5,245,527 A | * 9/1993 | Duff et al. ................... 363/131 |
| 5,422,440 A | 6/1995 | Palma |
| 5,430,636 A | 7/1995 | Kachi |
| 5,483,140 A | 1/1996 | Hess et al. |

(List continued on next page.)

FOREIGN PATENT DOCUMENTS

| EP | 0 597 144 A1 | 5/1994 |
| EP | 0 706 221 A2 | 4/1996 |
| EP | 0 706 221 A3 | 4/1996 |
| EP | 0 766 504 A2 | 4/1997 |
| EP | 0 892 487 A1 | 1/1999 |
| EP | 0 924 845 A2 | 6/1999 |
| EP | 0 978 934 A2 | 2/2000 |
| JP | 410201249 A | * 7/1998 ............ H02M/7/48 |

OTHER PUBLICATIONS

Adolfo F. Ponce De Leon, "Medium Voltage Drive Technology: A Compoarison," PCIM Online, Intertec International, Inc. 1998.

(List continued on next page.)

Primary Examiner—Michael Datskovsky
(74) Attorney, Agent, or Firm—Sughrue Mion, PLLC

(57) ABSTRACT

An AC drive which can be applied to any power using device and in particular is a medium voltage AC drive. In a preferred embodiment, a multilevel AC drive topology is implemented, with the drive including a plurality of inverters and converter electrically coupled through electrical buses and physically coupled through their respective modular bases, and sharing a common cooling system connected to the respective heat exchangers of each component. The AC drive generally is made up of a plurality of inverter modules, which are connected to a converter module, and with each of the above components packaged in a relatively small unit having a cooling apparatus.

42 Claims, 23 Drawing Sheets

U.S. PATENT DOCUMENTS

| | | | | |
|---|---|---|---|---|
| 5,508,908 A | * | 4/1996 | Kazama et al. | 363/141 |
| 5,517,063 A | * | 5/1996 | Schantz et al. | 307/9.1 |
| 5,532,907 A | | 7/1996 | Asselta et al. | |
| 5,552,952 A | | 9/1996 | Kramer et al. | |
| 5,637,918 A | * | 6/1997 | Tatuta | 257/686 |
| 5,663,858 A | | 9/1997 | Etter | |
| 5,808,240 A | | 9/1998 | Czerwinski et al. | |
| 5,910,892 A | | 6/1999 | Lyons et al. | |
| 5,929,519 A | | 7/1999 | Mori et al. | |
| 5,936,833 A | * | 8/1999 | Grossman et al. | 361/638 |
| 6,024,589 A | | 2/2000 | Hahn, IV et al. | |
| 6,058,031 A | | 5/2000 | Lyons et al. | |
| 6,064,578 A | * | 5/2000 | Hashimoto et al. | 363/16 |
| 6,102,109 A | * | 8/2000 | Osakabe et al. | 165/104.33 |
| 6,111,328 A | | 8/2000 | Ota et al. | |
| 6,160,696 A | * | 12/2000 | Bailey et al. | 361/115 |
| 6,292,363 B1 | * | 9/2001 | Shinohara et al. | 361/695 |
| 6,493,227 B2 | * | 12/2002 | Nielsen et al. | 361/703 |

OTHER PUBLICATIONS

"AC Drives Outlook Study," Automation Research Corp., Market Studies, Feb. 18, 1999.

Allen–Bradley Brochure for "PowerFlex 7000 MV Drive", May 2001.

"Introducing GE Innovation Medium Voltage Series AC Drives", GE Motors & Industrial Systems Brochure.

"GE Innovation Series AC Drives", GE Industrial Systems Brochure.

"SIMOVERT MV Drive Converters: The new medium-–voltage concept," Siemens Brochure.

"Cegelec launches IGBT rival to ABB's MV drive," Electrical Review, Apr. 28, 1997.

"Medium and high power variable speed AC drives," Cegelec Brochure.

"Super Energy Saving Inverter VARISPEED–686HV5", Yaskawa Brochure, Nov. 1997.

"The Mini Drive with Big Benefits", Rockwell Automation Allen–Bradley Brochure.

"The Highest Level of MV Motor Control From The World's Leading Supplier of MV Drives", Rockwell Automation Brochure, Dec. 1996.

"AC Variable Frequency Drives", Robicon Brochure 1994.

"Microdrive with STS Technology" Brochure, and Photo of AC drive shown at Oct. 9–12, 2000 International Mining Show, Las Vegas Nevada.

"Microdrive with STS Technology" Powerpoint Presentation made at Oct. 9–12, 2000 International Mining Show, Las Vegas Nevada.

Applicants's Statement listed in Information Disclosure Statement Under 37 C.F.R. §§ 1.97 and 1.98 regarding Oct. 9–12, 2000 International Mining Show, Las Vegas Nevada.

* cited by examiner

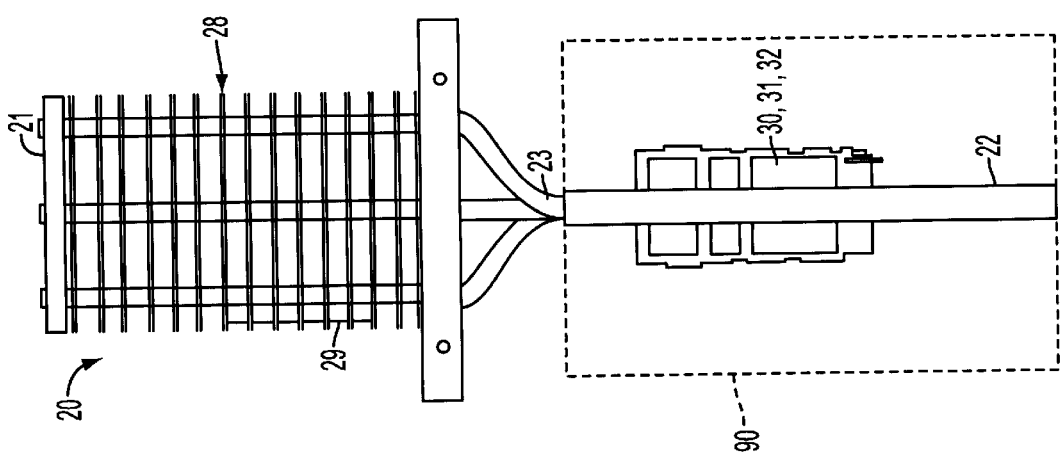

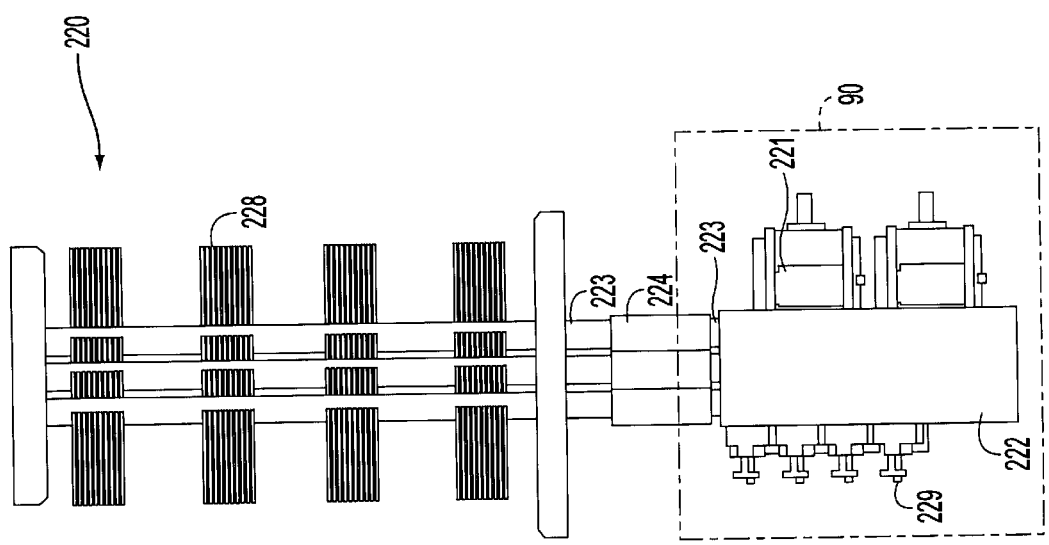

MICRODRIVE

This Application claims priority under 35 U.S.C. §119 from U.S. Provisional Application No. 60/245,158 filed on Nov. 3, 2000.

BACKGROUND OF THE INVENTION

1. Field of the Invention

The field of the present invention generally relates to the field of power converters, more particularly to medium voltage variable speed AC drives used to drive AC motors, and to drive various other power conversion equipment requiring 600 to 15,000 volts.

2. Discussion of Related Art

Adjustable or variable speed AC drives are commonly used to drive AC induction motors allowing for its speed control. AC drives generally provide the advantage of energy savings because they control the characteristics of its output voltage and current, and thus controlling the motor speed (of the motor they are driving) by the user, optimizing the motor power usage as well as the process it is driving. AC drives operate by taking either incoming AC or DC power, having a fixed frequency and voltage, and converting it to AC power having a voltage or current with variable amplitude and frequency. This allows for the control of the motor speed and power, a requirement in many applications.

Although the use of AC drives greatly enhances the processes they drive and provide electrical energy savings, their use is not without drawbacks. One of the biggest problems with current AC drive systems is their size. This is particularly true in AC drives used for medium voltage applications, which require a significant amount of floor or facility space. Additionally, because the AC drive components in existing systems are exposed to air (which is used as the means to cool the components of the systems, they are required to be located in clean, environmentally controlled areas requiring significant filtering, temperature and humidity control means, to keep harmful contaminants and humidity from adversely affecting the operation of the systems. Induction motors on the other hand are generally rugged not requiring a clean environment free of contaminants. This difference of environmental requirements will generally require a significant distance between drive and motor. This distance causes motor insulation problems due to reflective wave phenomena as well as motor dynamic control problems.

The state-of-the-art medium voltage power conversion devices use insulating methods similar to the ones used in low voltage (0 to 600V) devices. The power switches and interconnection buses have to have significant physical space between different electric potentials in order to avoid the effects of partial discharge degradation of the insulating materials. Because ambient air is present around all the components this distance can be fairly large. Moreover, the quality of the air incoming to the drive cabinet needs to be environmentally controlled because contaminants could surround the insulation devices and facilitate the ionization around the conductors and therefore generate corona effect or even cause a short-circuit. This large volume required for the sake of insulation will result in an increased stray inductance distributed in the interconnection devices. The interconnection devices can be either some sort of cables or bus bars. Because the power switches carry significant amount of electrical current, during the turnoff cycle the negative rate of change of the switch current will result in a voltage spike that is proportional to the magnitude of the current rate of change and the stray inductance of the circuit involved. ($Vpk=L*(di/dt)$, where L is the circuit stray inductance and $di/dt$ is the rate of change of the switch current.) These voltage transients will destroy the power semiconductor switches if not limited to adequate levels. State-of-the-art medium-voltage power conversion devices end up using voltage suppressing devices that are proportional to the amount of stray inductance. The addition of these transient voltage suppressors, which also require proper spacing due to insulation needs, ends up increasing the physical volume even further, as well as complexity and cost.

Another problem with many power conversion devices and in particular in AC drives is component replaceability. Because the internal make-up of present AC drives is generally complex, when one component, such as a semiconductor power switch fails, it is often the case that a significant amount of time is required to replace the damaged component.

A further problem of medium voltage AC drives is their susceptibility to cosmic rays. Although all of the aspects of this phenomenon are unknown, it is known that subatomic particles emitted from various celestial bodies impact the earth, and everything on it, including the components of power conversion systems. These high-energy particles cause the destruction of the semiconductor atomic structure and thus, its ability to withstand their rated voltage. Therefore, cosmic rays cause the deterioration over time of some of the electrically live components in AC drives, such as the semiconductor power switches like the IGBT—Insulated Gate Bipolar Transistor and the IGCT—Integrated Gate Commutated Thyristor. This phenomenon limits the voltage utilization of a power semiconductor switch to about sixty percent of its rated DC value. If used above this voltage level the power semiconductor switch will have a significant shorter life cycle.

SUMMARY OF THE INVENTION

The present invention is directed to solving the above problems in power conversion equipment, by allowing more compact devices which can be placed near, or directly adjacent to, the machine or load being driven, without any of the above adverse effects. This invention is a unique combination of available state-of-the-art and cutting edge technologies of different technological areas. It allows for an efficient, environmentally rugged, flexible and compact power conversion system for low, medium and high voltage applications. This invention enables the design of power conversion building blocks with unprecedented features using either gas or liquid fluid as coolants.

This invention can be applied to any power conversion device and in particular to medium voltage AC Drives. The electrical topology used in the present invention is similar to ones used in state of-the-art power conversion equipment. In the preferred embodiment, a multilevel AC drive topology is implemented. The plurality of inverters and converter are electrically coupled through electrical buses and physically coupled through their respective modular bases, and may share a common cooling system connected to the respective heat sinks of each component. The novel arrangement of the interconnecting bus and power components, the insulation, the cooling system and the cosmic ray filtering eliminate the problems stated above with present AC drives, while allowing the drive to have extended, efficient operational life, take a small amount of space, be easily repairable and be located in close proximity to the load device being driven. A more detailed discussion of the present invention will follow, starting with a brief description of the elements.

In the present invention, an AC drive is made up of a plurality of inverter modules, which are connected to a converter module to create the AC drive, wherein each of the above components is packaged in a relatively small unit having a cooling apparatus. Each of the inverters is made of a modular base, a heat sink or exchanger connected to the base having a plurality of power semiconductor switches thermally coupled thereto, a plurality of capacitors, a plurality of electrical buses connecting the power semiconductor switches to the capacitors, and an insulative medium which encases or covers some or all of the electrically live components, such as the electrical buses. The converter is similar in construction, in that it is made up of a modular base, a plurality of power semiconductor switches or diodes, capacitors. a reactor, a heat sink or exchanger, a plurality of contactors and an insulative material covering the electrically live components, such as the buses.

BRIEF DESCRIPTION OF THE DRAWINGS

The advantages, nature and various additional features of the invention will appear more fully upon consideration of the illustrative embodiments of the invention which are schematically set forth in the drawings, in which:

FIGS. 1A, 1B, and 1C show a diagrammatical representation of an exemplary embodiment of a heat exchanger assembly to be used with the present invention;

FIGS. 3A, 3B, and 3C show a diagrammatical representation of an additional exemplary embodiment of a heat exchanger assembly to be used with the present invention;

DETAILED DESCRIPTION OF THE INVENTION

The present invention will be explained in further detail by making reference to the accompanying drawings, which do not limit the scope of the invention in any way. Further, it should be noted that although the following detailed discussion is related to medium voltage AC drives which range from 600 to 15,000 volt capacity, the following concepts can be applied to any voltage level power conversion devices. For purposes of illustration, and not limitation, the embodiment of the present invention discussed below is a 3 level, 4,160 volt, 2,500 HP, 12-pulse AC input drive. Therefore, any specific or preferred dimensions or parameters mentioned below are for such a drive and may not be optimal or preferred with a drive having different operating characteristics, but such dimensions and parameters will be able to be optimized in view of the following discussion.

Figure 1A:
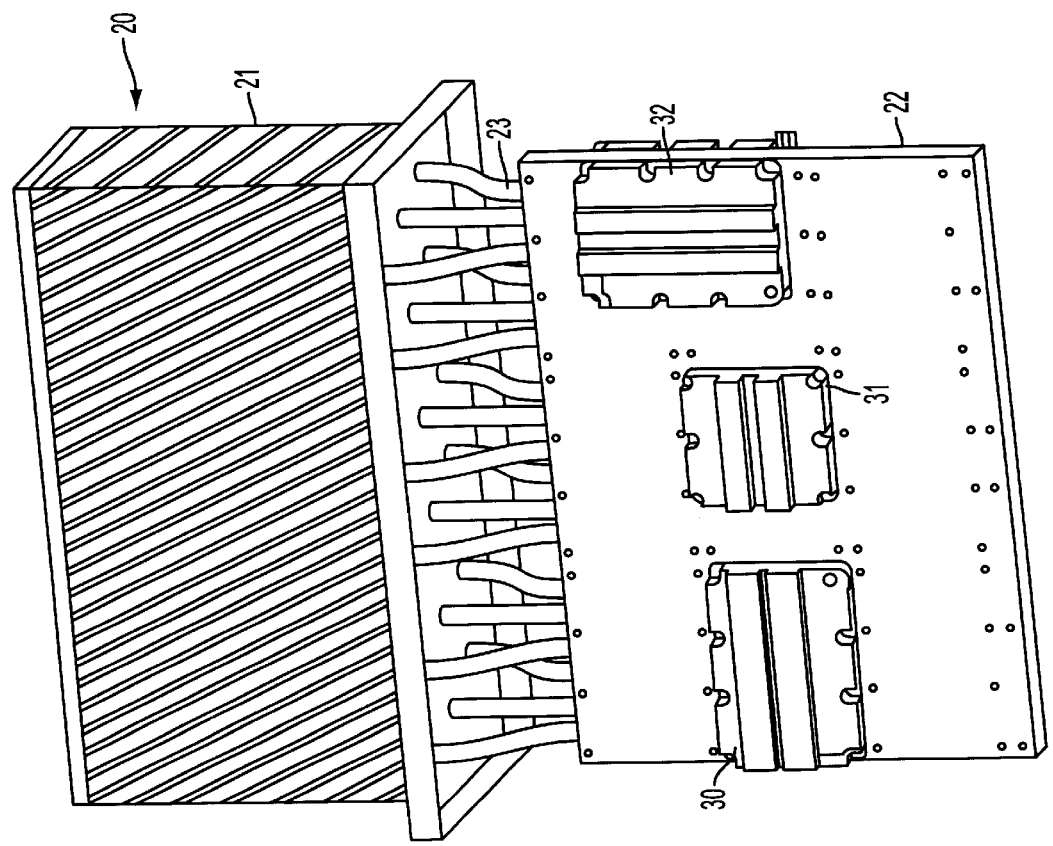
Figure 1B:
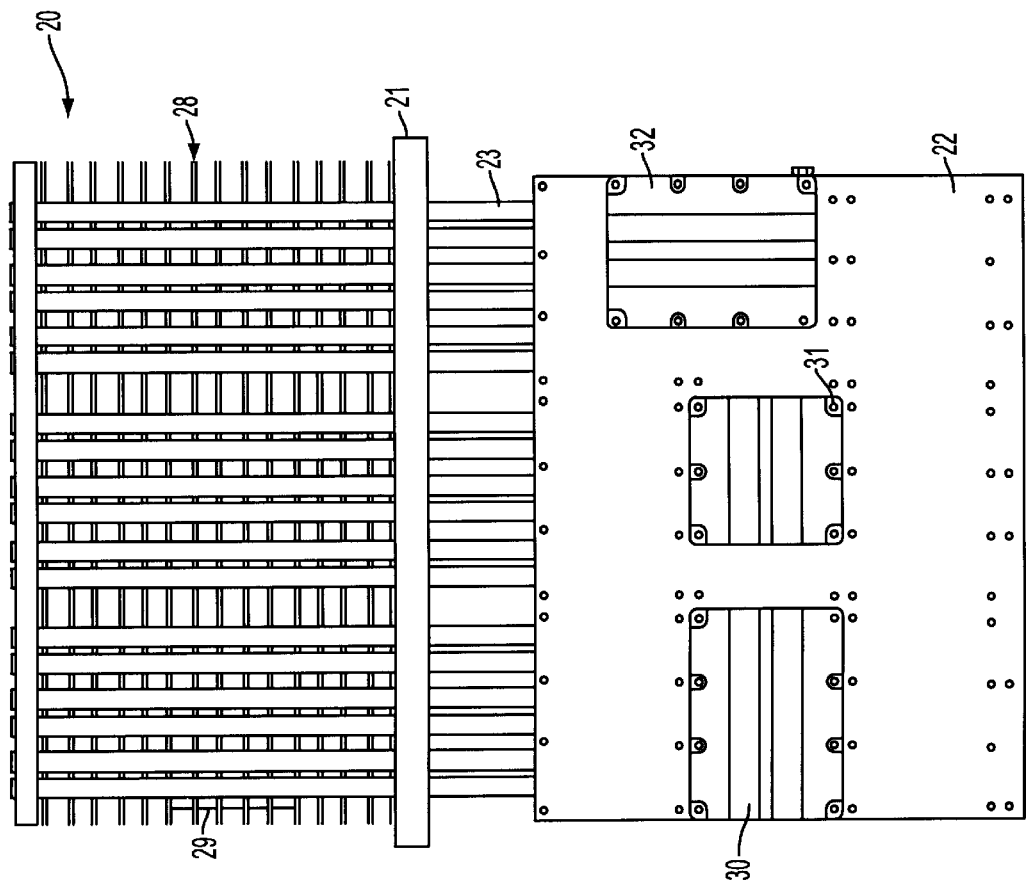

Turning now to FIGS. 1A, 1B, and 1C, an exemplary embodiment of a heat exchanger assembly 20 is shown with transistors 30, 32 and a diode 31 secured thereto. In the embodiment shown in these Figures, the heat exchanger is an air-cooled type, which uses air, or other gases to provide the cooling for the heat exchanger. The heat exchanger assembly 20 has a heat exchanger condenser block 21 thermally connected to a evaporator plate 22, which in this embodiment, holds the transistors 30 and 32, and diode 31. The heat exchanger condenser block 21 is a structure used to allow the heat generated by the transistors 30 and 32 and diode 31 to be transferred to a cooling medium such as air, which is passed through the condenser block 21.

The condenser block 21 can be made from any material which has good thermally conductive characteristics, such as aluminum, copper, etc. Further, in the Figures, a heat exchanger assembly 20 is shown having a series of heat pipes or tubes 23 to enable the transfer of the heat into the condenser block 21 and then into the cooling medium. It will be understood that the configuration of the heat exchanger condenser block 20 is not limited to this configuration, and may be modified in any shape or fashion so as to allow the optimal efficiency of the transfer of heat to the cooling medium. This is particularly applicable depending on the cooling medium which is used. Although air is preferred as the cooling medium (for the assembly shown in these Figures), other mediums, such as other gases, water, antifreeze, or oil can be used, by passing them through the condenser block 21. It should be further noted, that if air is not used as the cooling medium then additional precautions generally must be taken to prevent the cooling medium from entering the components of the AC drive.

In the preferred embodiment of the present invention, in the heat exchanger assembly 20, in addition to heat pipes 23, a stack of fins 28 compose the condenser block 21 (FIG. 1B) to provide an additional thermal surface to increase the efficiency of the heat exchanger assembly 20. It is preferred that the heat pipes 23, and the fins 28 be made from a thermally conductive material, such as aluminum, copper, etc. Also it is preferred that the fins 28 each have a stabilizing separator 29 positioned therebetween to prevent adjacent fins 28 from being damaged or bent such that the thermal characteristics of the fins 28 are compromised. This can be done by any known or commonly used method, such as dimpling the fins, so the dimples act as spacers or stabilizers 29. Without these stabilizers 29 it is possible for the fins 28 to be bent such that no air, or other cooling medium, would be able to pass through two adjacent fins 28, thus reducing the cooling efficiency of the heat exchanger 20. The use of these separators 29 generally is dictated by the mechanical and/or thermal conditions under which the AC drive is used or to which it is exposed. If there is a large cooling margin or if the condenser block section is protected by other mechanical means, such that the risk of bending and damage is not of a significant concern then the separators 29 may not be needed.

Further, the fins 28 can be secured to the heat pipes 23 by any known or commonly used means, such as friction fit, soldering, welding, adhesive bonding, fasteners, etc. The spacing between the fins 28 and the fin 28 thickness should be optimized for the specific use and configuration of the AC drive, taking in to account the material used, the cooling medium used, the amount of heat transfer needed and the environment in which the AC drive is being used. In the exemplary embodiment of the present invention, it is preferred that the fin material used is aluminum, with the fins 28 having a thickness of 0.020 inches with 9.0 inches of width and the length determined by the transistors and diode dimensions, and having a spacing of 0.125 inches between fins 28, and the heat pipes 23 generally having a diameter of 0.75 inches, such that six of the heat pipes 23 can cool 3000 Watts of heat energy at 50 degrees Celsius temperature rise at a maximum ambient temperature of 40 degrees Celsius. Smaller heat pipe diameters will yield lower cooling capacity per pipe and larger diameters will yield higher cooling capacity. With current industry standards the range of the heat pipe diameter that can be used is from 0.250 inches to 1.50 inches inch. However, the present invention is not limited to the use of these dimensions.

As stated previously, the condenser block 21 is thermally coupled to an evaporator plate 22 which is used to mount the transistors and diodes 30, 31 and 32. The evaporator plate 22 is preferably made from the same thermally conductive material as the condenser block 21, and could be either made separately and secured to the condenser block 21 through the heat pipes 23, or can be formed integrally with the condenser block 21. If the heat pipes 23 are used it is preferred that the pipes be secured to the evaporator plate 22 through soldering, where insertion holes in the evaporator plate 22 have solder placed in them and the heat pipes 23 are inserted such that the solder rises around and seals the heat pipes 23 into the evaporator plate 22. It is also noted that to ensure the proper use of heat pipes 23 none of the fastener holes used to mount structure or components to the evaporator plate 22 should coincide with the heat pipe location, otherwise the efficiency of the heat pipes 23 would be compromised. The exact number, shape, configuration and size of the heat pipes 23 used should be determined depending on the characteristics and design parameters of the AC drive. If the heat pipes 23 are not used, the evaporator plate 22 can be secured to the condenser block 21 by any commonly known or used methods. However, the connection between the condenser block 21 and evaporator plate 22 generally should be such that the thermal conductivity from one to the other is optimized to provide maximum cooling efficiency for the heat exchanger 20.

The evaporator plate 22 can be a simple flat plate, as shown in FIGS. 1A, 1B and 1C or can be formed in various other configurations or shapes, such as rectangular, cylindrical and other configurations. The transistors and diodes 30, 31 and 32 are mounted to the evaporator plate 22 at any location that allows for the optimal performance of the AC drive. This configuration aids in having an easily manufacturable AC drive where the same heat exchanger assembly 20 can be used in different AC drives having different transistor locations, sizes and configurations. Moreover, the use of a large flat evaporator plate 22 has an additional advantage with regard to the thermal management of the system, which will be discussed in more detail below.

The transistors and diodes 30, 31, 32 can be any known or used transistors and diodes that are needed for the particular application of the AC drive. The transistors shown in FIGS. 1A, 1B and 1C generally are IGBT transistors, although the present invention is not limited solely to the use of these types of electrical components and any other types of known or commonly used components for AC drives can be substituted without changing the scope or spirit of the present invention.

Figure 2A:
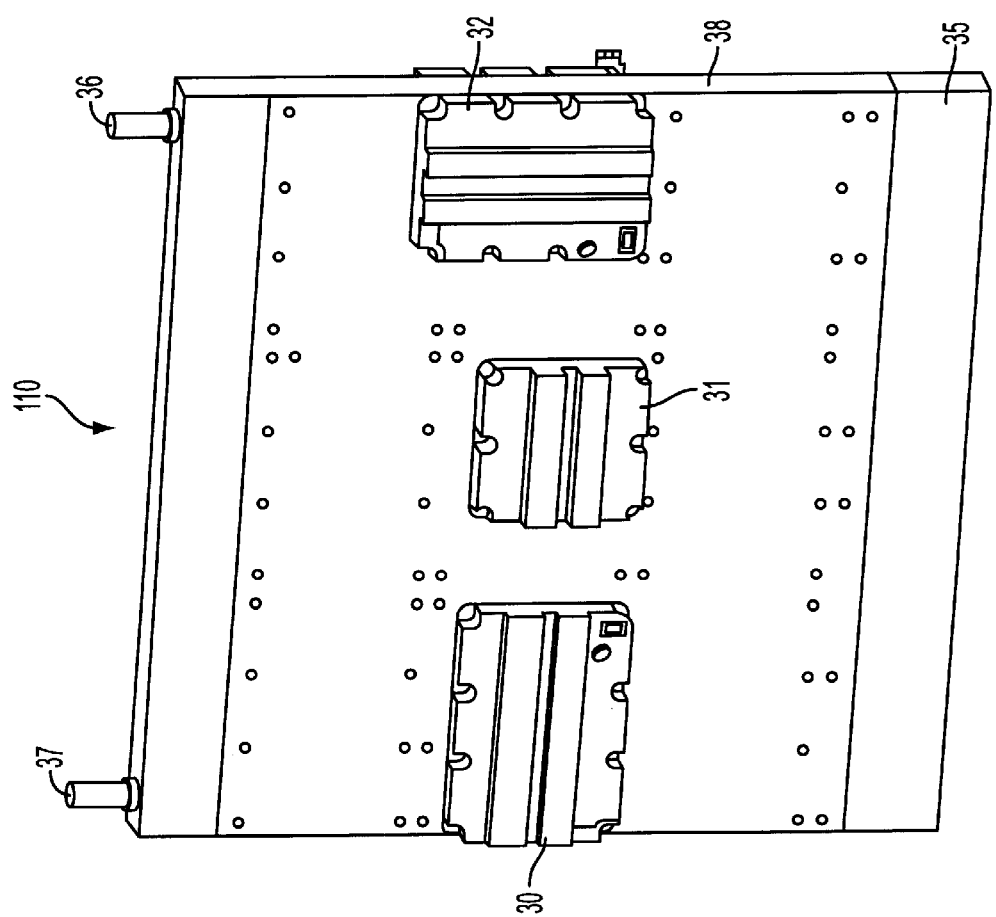
FIGS. 2A and 2B show a diagrammatical representation of an alternate exemplary embodiment of the heat exchanger assembly depicted in FIGS. 1A, 1B, and 1C.
Figure 2B:
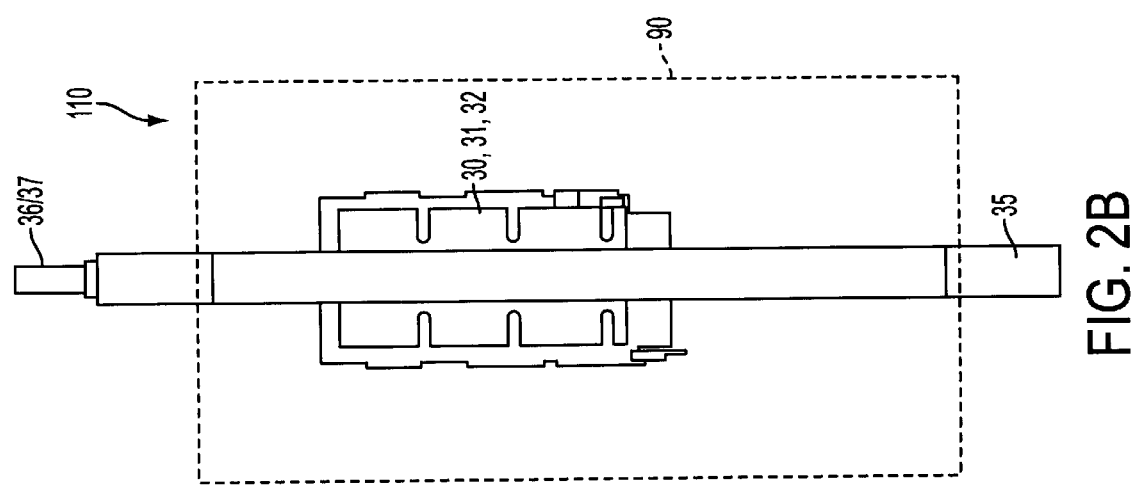

Turning now to FIGS. 2A and 2B an alternate embodiment of a heat exchanger assembly 110 for the present invention is shown. Unlike the previous embodiment, this embodiment does not use the heat exchanger condenser block 21 but uses a mounting cooling plate that works like a manifold (a metal plate with a serpentine like passage for fluids) formed by return block 35 and cooling plate 38 through which a cooling medium, such as air, gas, oil, antifreeze, water, etc. is passed to provide thermal management of the electrical components 30, 31, 32. In the embodiment shown in FIGS. 2A and 2B the electrical components are secured to a cooling plate 38, through which the cooling medium passes, while the return block 35 is used to channel the cooling medium through the cooling plate 38 to form a serpentine like passage and to provide inlet and outlet of the cooling medium. The cooling medium generally enters the return block 35 through an entry port 36 and exit through an outlet port 37 to a pump system (not shown) so as to ensure constant flow through the condenser block 35. The exact configuration of internal aspects of the return block 35 and cooling plate 38 typically will be determined depending on the needs and operational criteria desired, but again it is preferred that any mounting holes on the condenser block 35 not interfere with the path of the cooling medium within the cooling plate 38.

It should be noted that because this embodiment does not have a large heat exchanger condenser block 21, as in FIGS. 1A–1C, the space above the return block 35 can be used for the coolant filters, radiator, pumps, reservoirs, etc. of the cooling system, without adding any significant additional size to the AC drive. In fact, this configuration allows a self-contained liquid cooled heat exchanger assembly to be used adjacent to an air cooled heat exchanger assembly with relatively little change in the overall structure and operation of the AC drive. This capability was not previously available in the prior art.

Figure 3A:
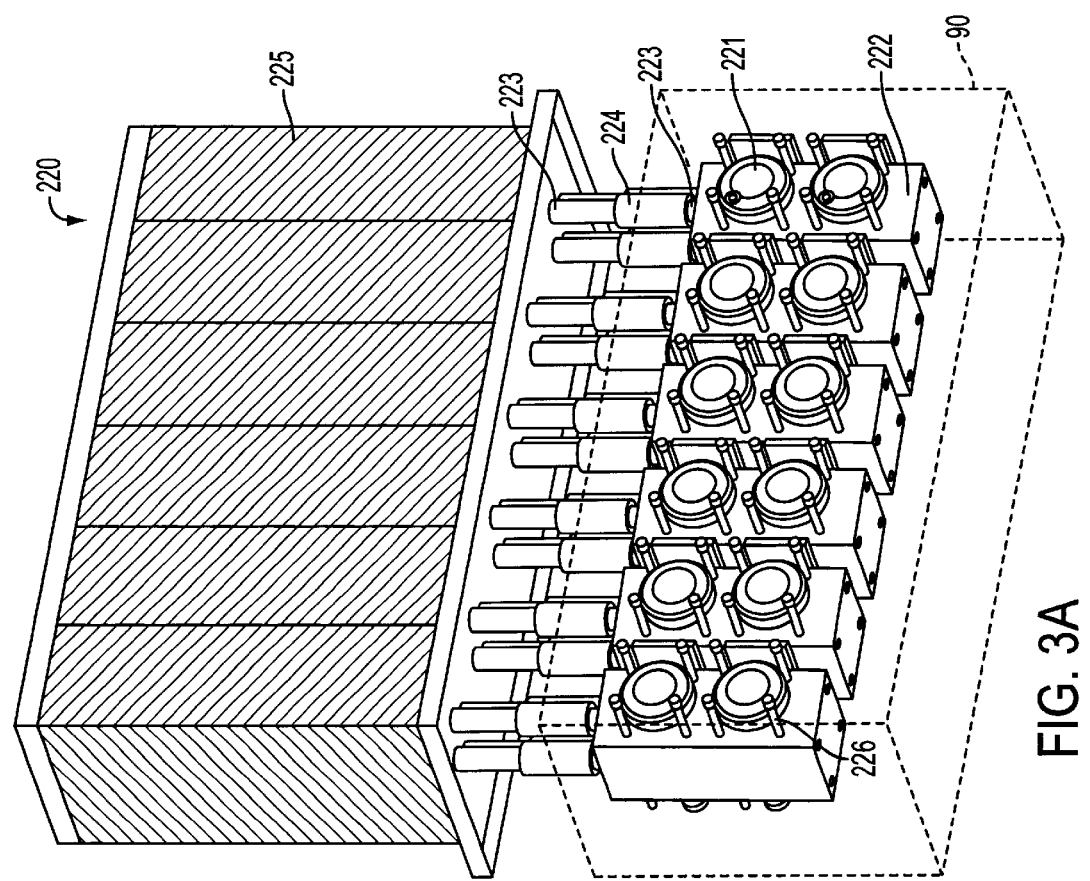
Figure 3B:
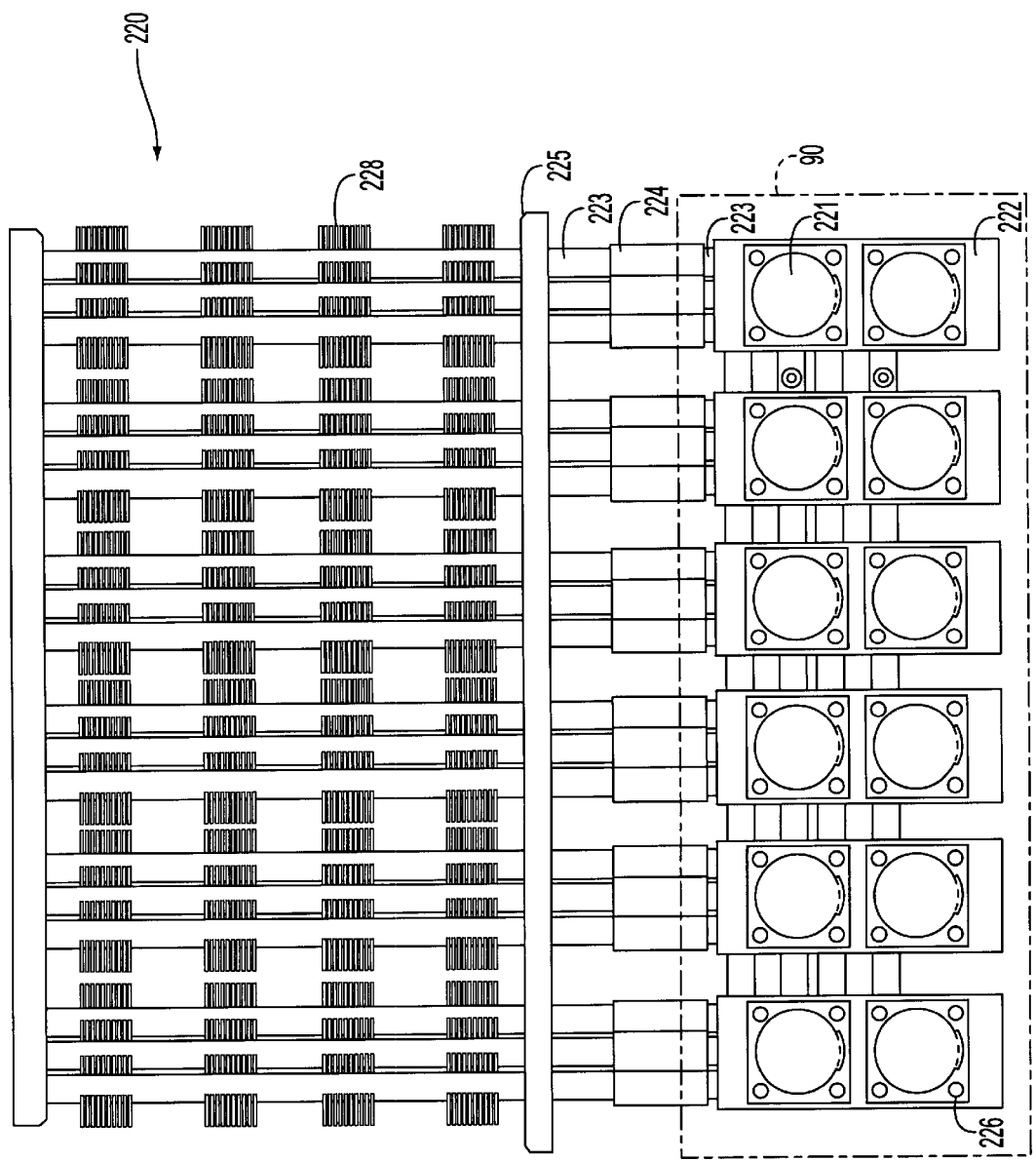

FIGS. 3A, 3B, and 3C show yet another exemplary embodiment of a heat exchanger assembly according to the present invention. These Figures show a heat exchanger assembly 220 using non-isolated power semiconductor switches 221, which are yet another type of electrical device which can be used (these are commonly known as "hockey puck" switches). These devices 221 generally can handle higher power than IGBT's, but their non-isolated cooling process requires that the mounting plates (also called evaporator plates) 222 connected to the devices 221 be isolated from each other and the rest of the cooling system, as shown in the Figures. Therefore, if heat pipes 223 are used, the heat pipes 223 connected to the mounting plates (also called evaporator plates) 222 are electrically isolated from the heat pipes connected to the heat exchanger condenser block 225 by the use of ceramic (or other insulative material) spacers 224. These insulative spacers 224 provide protection from electrical current flowing to the assembly 220 from the devices 221. The devices 221 can be secured to the mounting plates 222 by any commonly known or used method, although the fasteners (generally called box clamps) 226 are recommended by the manufacturer of the devices.

Figure 4A:
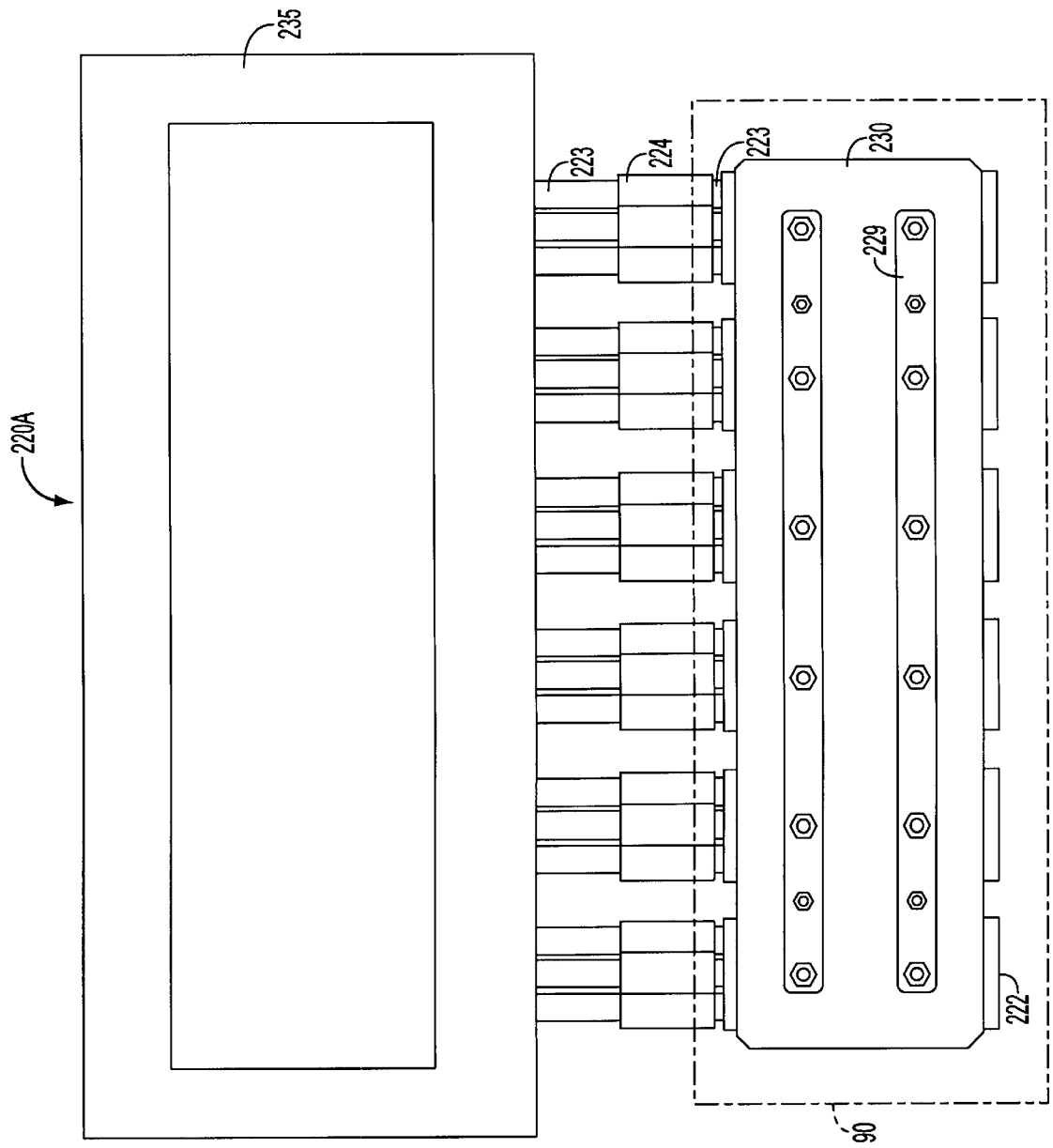
FIGS. 4A and 4B show a diagrammatical representation of an alternate embodiment of the heat exchanger shown in FIGS. 3A, 3B, and 3C.
Figure 4B:
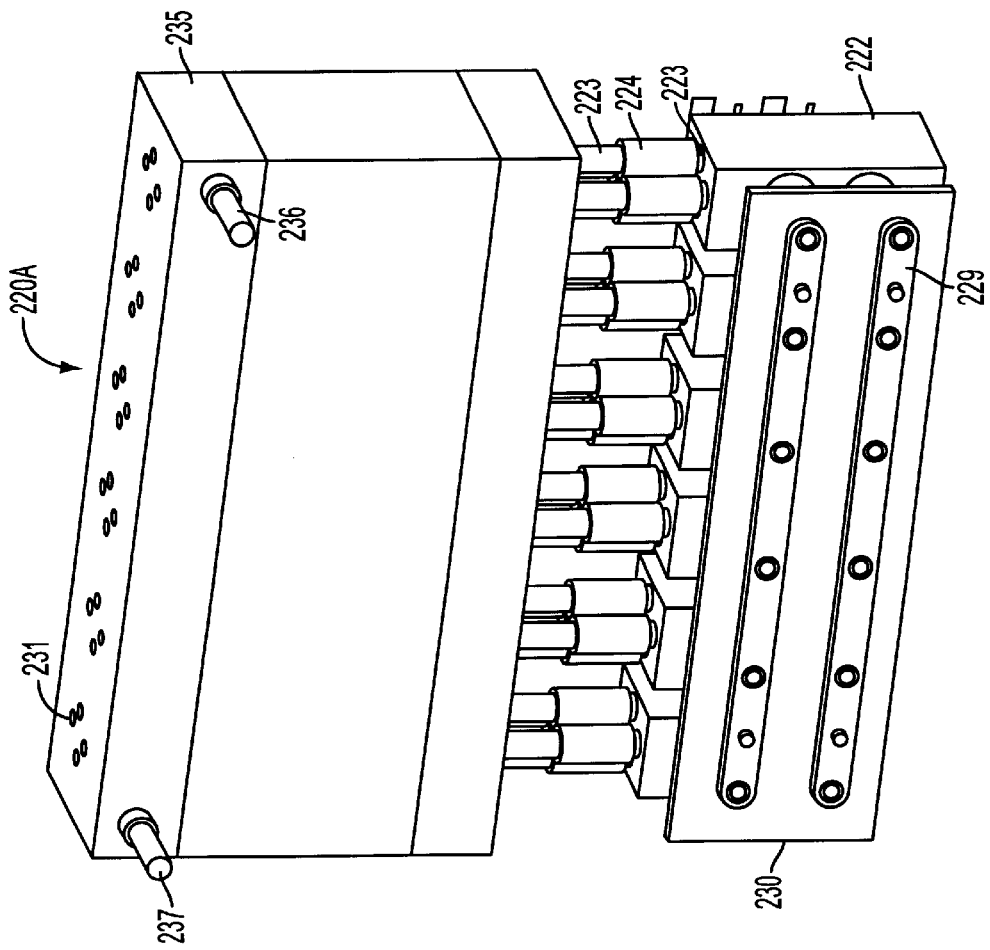

FIGS. 4A and 4B show a yet another exemplary embodiment of a heat exchanger assembly 220A that can be used with the present invention. This embodiment is similar to that shown in FIGS. 3A, 3B and 3C except that instead of an open condenser block 225 a closed cooling manifold block 235 is used, where instead of passing a cooling medium over fins of condenser block 225, the cooling medium is passed through the manifold block 235, operating in a similar way as the cooling manifold plate 38 and return block 35 shown in FIGS. 2A and 2B. In this configuration the mounting plates (also called evaporator plates) 222 are not electrically connected to the cooling manifold block 235 but are isolated through the use of heat pipes 223 and insulative spacers 224. This configuration generally is preferred when using a liquid cooling medium and the electrical devices are of a non-isolated type or the so called "hockey puck" devices. This is because the mounting plates 222 remain separated while remaining thermally coupled to the cooling manifold block 235.

Also shown in these Figures are the electrical buses 229 and insulator 230 which are used to interconnect the devices 221.

The various embodiments of the heat exchangers for the present invention function by having the heat generated by the electrical devices (whether IGBT or non-IGBT) pass to a mounting structure (also called evaporator plate when heat pipes are used) and into a heat exchanger manifold (also called condenser block when heat pipes are used) or to a cooling fluid source (whatever the configuration) and then into a cooling medium (whatever is chosen). Further, the configurations discussed above for various heat exchanger assemblies are compact and relatively easy to manage, which allows each module of an AC drive (i.e. inverter, converter) to have its own independent and separate cooling method or system, and as such would allow modules having different cooling methods used in the same AC drive assembly. For example, an AC drive can be made where all of the inverters used the embodiment shown in FIGS. 1A–1C, using air cooling, while the converter uses the embodiments shown in FIGS. 2A–2B.

Figure 5A:
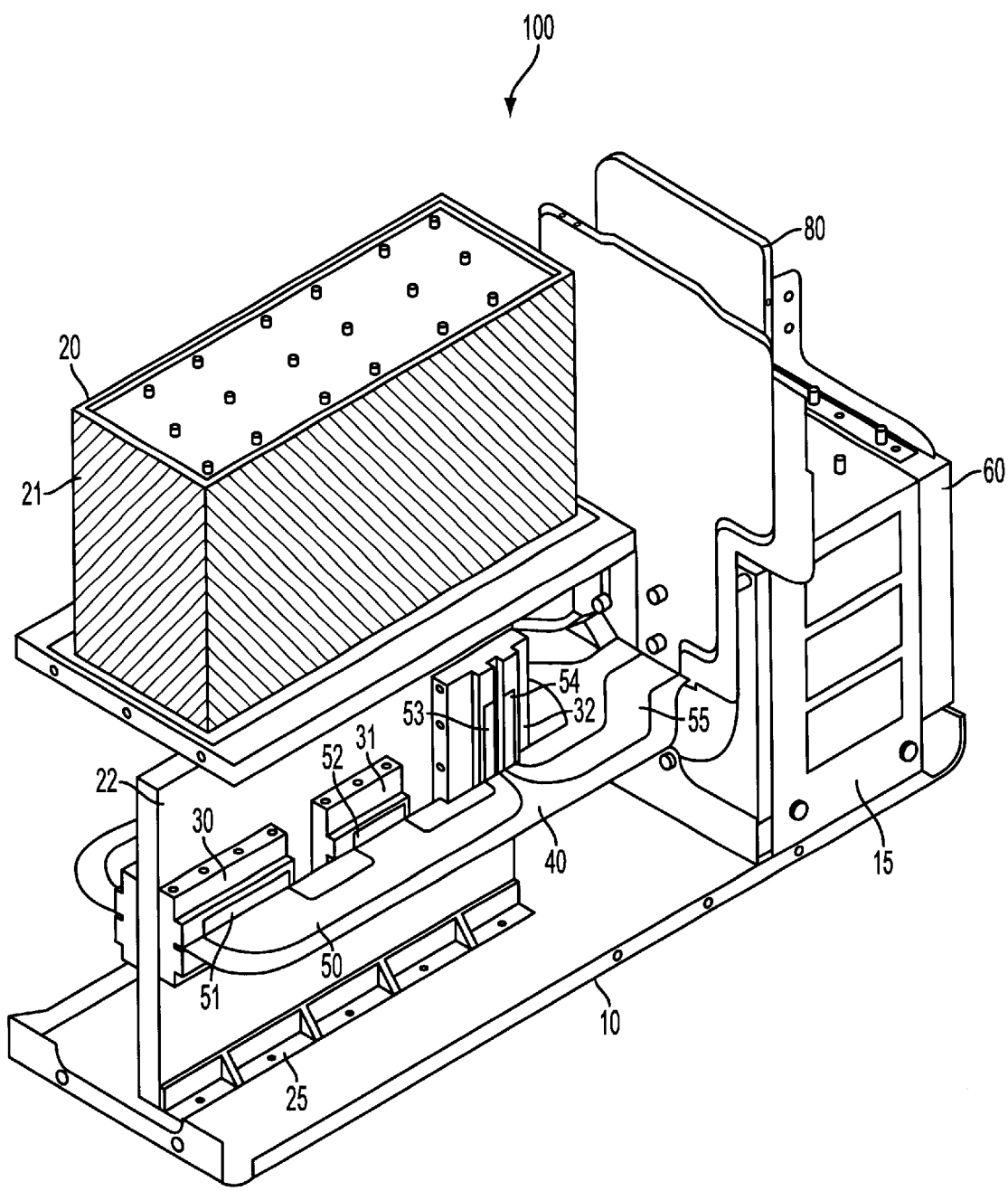
FIGS. 5A, 5B, and 5C show a diagrammatical representation of an exemplary embodiment of bus work in an inverter assembly in accordance with the present invention.
Figure 5B:
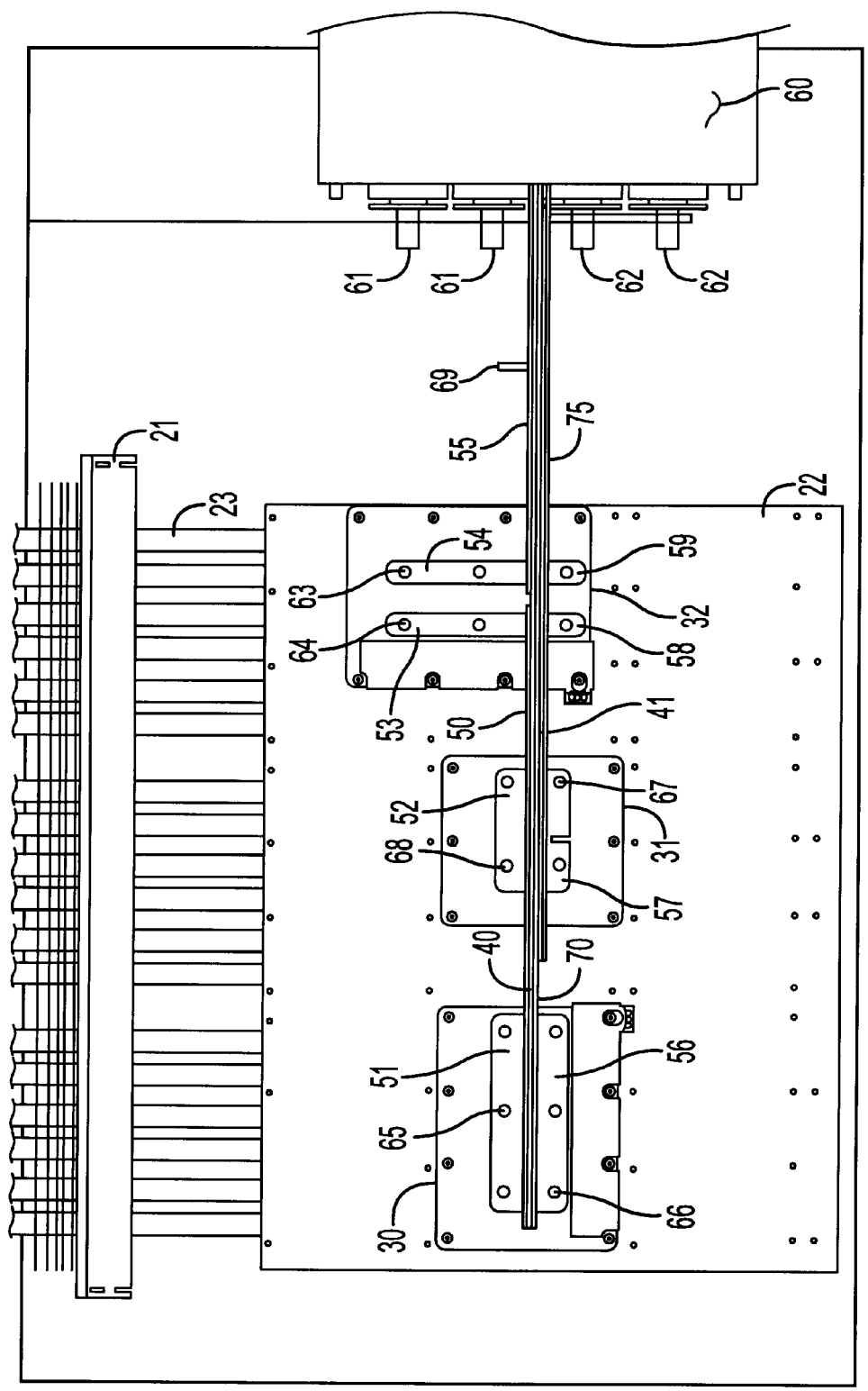
Figure 5C:
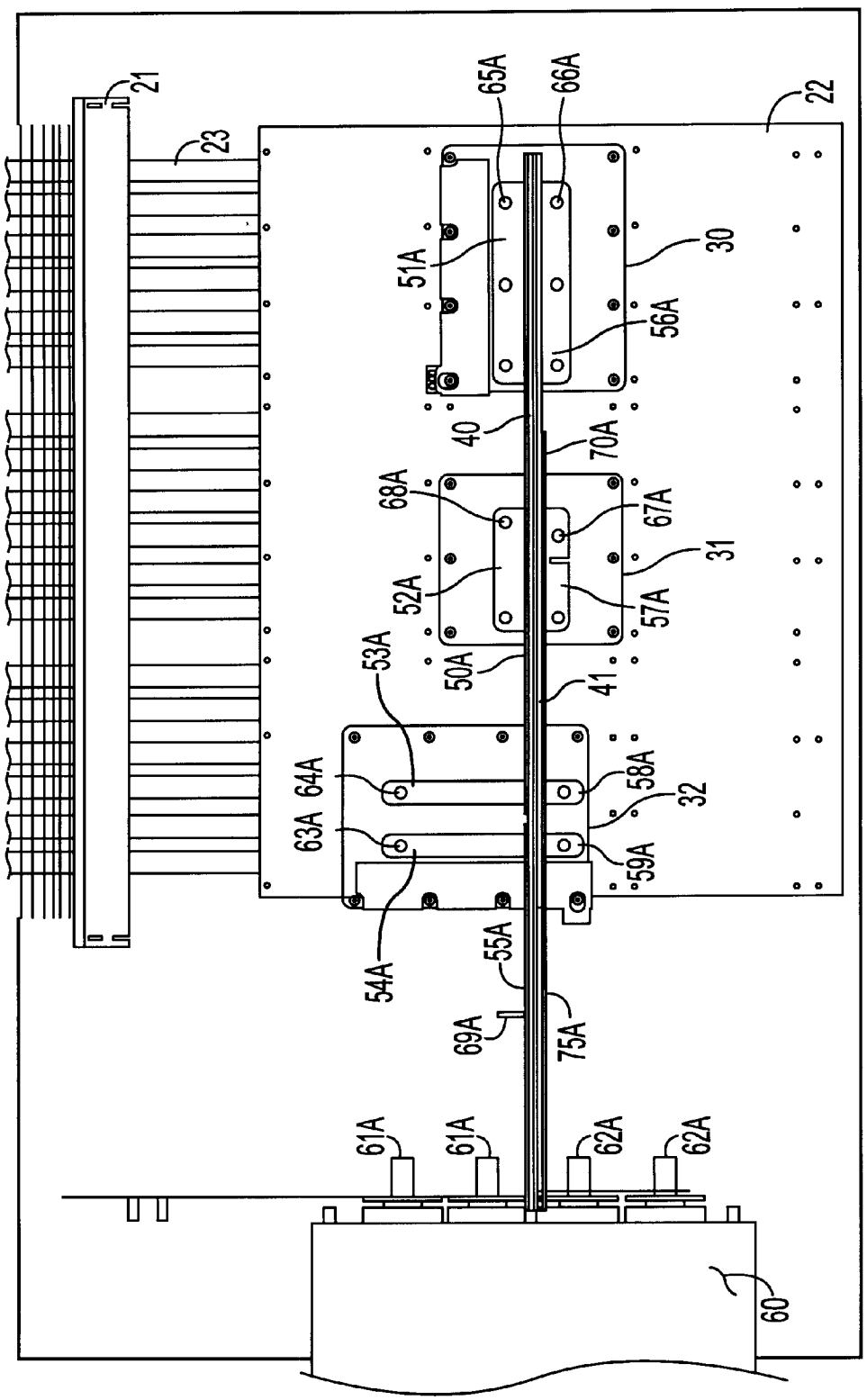

FIGS. 5A, 5B and 5C depict a partial assembly of an inverter 100 according to the present invention. Although the inverter shown is employing a heat exchanger assembly 20 as depicted in FIGS. 1A, 1B and 1C, the present invention is not limited to such a configuration and any of the previous heat exchanger embodiments can be employed without altering the scope of the present invention.

It should be noted that the AC drive of the present invention would comprise a plurality of inverters 100, typically the number would be three, but may be varied depending on the type of application for which the AC drive is being used. The inverter 100, of the present invention, is set in a modular base 10 which allows all of the components of the inverter to be mechanically secured to the base 10. Further, the base is designed such that it can be easily secured to (or detached from) an additional component of the AC drive, such as an additional inverter 100, or a converter 200. The trays 10 of adjacent components (i.e. inverters/converters) can be secured to each other by any known or commonly used method, such as bolts, screws, rivets, etc. As stated previously, it is preferred that a method of attachment be used which allows an inverter 100 or converter 200 assembly to be removed from the AC drive with relative ease. For example, by simply removing the air duct that involves the condenser block of the heat exchanger assembly 20 and the four bolts in the four corners of the modular base 10 (if bolts are used), the inverter 100 can be removed from the top or from the side, depending on the engaging feature on the modular base 10. This will greatly reduce the amount of time and effort needed to replace a component.

The heat exchanger assembly 20 can be secured to the tray 10 by any commonly known or used methods. For example, mounting brackets 25 may be used to secure the assembly 20 to the tray 10, where the brackets 25 are secured with screws, bolts, rivets, etc.

Attached to each tray 10 is a capacitor bracket 15 which can be either mechanically secured to the tray or made integrally with the tray 10. The bracket 15 provides support for a capacitor bank 60, having a number of capacitors 61, 62. Any commonly known or used power capacitors 61, 62 can be incorporated with the present invention, without affecting the operation of the present invention. The capacitors used must be low inductance type (the type used in the preferred embodiment has inductance values less than 30 nano Henry) and be capable of withstanding high ripple current. The preferred embodiment uses oil or gas filled polyethylene film, non-polarized capacitors that are rated at 4000V and 550 Microfarad for 4160V operation such as the Montena Direct Current Power Capacitors. Also secured to the capacitor bracket 15 is a connect area 80 which is configured to connect the inverter 100 for whatever application or use is desired.

Connecting all of the transistors and/or diodes 30, 31 and 32 and the capacitors (and other major electrical components) are electrical buses 50, 55, 70, 75, 50A, 55A, 70A, and 75A. The buses carry the electrical current to, and from, all of the major electrical components (and to adjoining inverters and converters). The buses for the present invention are most accurately described as balanced low inductance buses, and the inverter of the exemplary embodiment shown is a multilevel inverter bridge.

A multilevel inverter bridge has a more complex electric current path layout than that of a two level. Semiconductor switches and diodes are limited at a given time to a maximum operating voltage. Multilevel topologies are used to achieve higher output voltages of the power conversion device by effectively connecting power semiconductor switches in series and therefore multiplying their voltage capability by the number of switches connected in series. In the present invention, the mechanical layout of the switches and diodes is defined to prevent current loops. Electrically conductive buses connect the switches and diodes in such a way that every electromagnetic field generated by the electrical currents in the circuit is counteracted instantaneously and exactly, in magnitude and in phase. This is what is referred to as a balanced low inductance bus. It allows for evenly distributed electric fields and for minimization of the stray inductance of the electric current path, thus minimizing the voltage transients at the switches' turn off time. These features are particularly important in medium voltage devices in order to minimize the effects of partial discharge, insulation fatigue and eliminating the need of voltage transient suppressors. Inductance in this type of system can be determined by the following formula:

$$L=[31.9*(D+SD)*(L)]/[(W)]$$

Where:

L is the total inductance of the conductive bus bar,

D is the dielectric thickness between the parallel bus bars,

W is the width of the conductive bus bar,

L is the length of the conductive bus bar, and

SD is the skin depth of the current passage inside the conductive bus bar due to skin effect at high frequency and defined by: $SD=1/[\sqrt{(\pi F\ M\ N)}]$. Where F is the frequency of the electrical current; M is the magnetic permeability of the metal and N is the conductivity of the metal. E.g. for copper SD=2.6/[√F].

As it can be seen, the inductance is directly proportional to the dielectric thickness. In this invention the reduction of D, the dielectric thickness is made possible because of the elimination of air by vacuum and/or dipping the bus bar assembly into an insulating medium that keeps air, humidity and contaminants away. This will be discussed in more detail below.

The buses generally are made from any electrically conductive material, such as copper, aluminum, steel, etc. However, aluminum is preferred in the exemplary embodiment shown. The use of aluminum serves to provide higher resistance values per inch than other materials, such as copper, which aids in dampening the AC drive system electrically. Although the shape and dimensions of the bus bars may be changed as needed for the various configurations that are contemplated, or for alternate transistor placement, there are certain aspects of the geometry of the bus bars which are important to the optimal operation of the present invention. In the preferred embodiment, the thickness of the bars are $\frac{1}{8}^{th}$ of an inch, and although the width of the bus bar can vary, it is preferred that the width of the bus bars be significantly larger than the thickness of the buses (refer to the inductance formula above). Further, there are to be no sharp corners or edges on the buses. The bus bars typically have rounded edges, to aid in reducing the adverse effects of electrical field concentration. The bus bars also generally are formed as short as possible to reduce inductance (refer to the inductance formula above) and to improve the manufacturing and assembly characteristics of the bars.

The effects of high voltage potentials are well known and include the corona-effect due to ionization of gases around electrically live terminals and buses. The shape of the exposed electrically live terminals and buses can exacerbate the corona-effect that effectively extends the conductivity path of the metal terminal into the surrounding gases such as air, and undermining the insulation barrier placed in between terminals of different electric potential. Corona effect can cause the breakdown of insulation. In the present invention, the application of insulation is done to substantially reduce the corona effect. Further, the ionization of air molecules in pockets between insulation materials can cause what is known as partial discharge phenomena. This phenomenon causes electric charges to discharge inside the air pockets releasing high heat in the form of an electric arc. Eventually, after repeated discharge, or arcing, inside the air pocket, carbon tracking will form a bridge across the air pocket. The arcing and carbon tracking generation, deteriorate the insulation layers between buses and other electrically active devices over time. Both corona-effect and partial discharge are exacerbated by the many factors, including: (1) sharp-cornered conductor surfaces, particularly when exposed to air, with partial discharges increasing the amount of the charges for a given insulation thickness; (2) air or gas filled cavities or crevices surrounded at least partially by using insulating materials or conductors; (3) air or gas filled spaces between plane surfaces of conductors and insulating materials; and (4) small, exposed areas on insulating materials that have lower surface resistivity than surrounding areas.

In the preferred embodiment, the bus bars are polished prior to assembly to remove any and all defects that may exist in the surface of the buses, which helps optimize the performance of the buses, and aids in reducing electric field concentration as much as possible.

FIGS. 5B and 5C show the balanced low-inductance interconnection bus for a three level inverter bridge implemented in accordance with the present invention. In these Figures each side of the heat exchanger 20 is shown, even though in this embodiment the sides are symmetrical (which does not always have to be the case). In the embodiment shown, the bridge leg is divided into two parts: the positive half and the negative half. As shown in FIGS. 5B and 5C, one side is used for positive current flow while the other is used for the negative current flow. In the preferred embodiment, the layout of the power semiconductor switches 30, 31, 32 is done so that the instantaneous current path is well determined.

The following discussion will refer to what is shown for FIG. 5B which shows the positive half of one third of the three-level inverter bridge, but would be the same for 5C which shows the negative half of one third of the three-level inverter bridge. In the configuration shown, the system includes an IGBT switch 32, a diode 31, and a second IGBT switch 30. Because the current of the switch 30 is always turned on whether or not the diode 31 or switch 32 is on, it is preferred to locate this switch 30 farthest from the capacitor bank 60. Capacitor bank 60 is composed of two capacitors placed side-by-side, one serving the positive half and the other the negative half of the one third of the three-level inverter bridge. (It should be noted that the locations of these components can be changed as needed depending on the desired configuration without altering the scope of, or affecting the present invention.) Next to the switch 30 is the diode 31 which carries the neutral current, and next to the diode 31 is the switch 32 which carries the positive current (or negative current, shown in FIG. 5C). The switch 32 is connected to the capacitor terminals 61 through the electrical bus 55, and to the diode 31 and switch 30 through the bus 50. If the switch 32 is turned on and the diode 31 is off then the current path goes from the capacitor terminals 61 to the switch 32 at the terminal 63, then through the switch 32 out through the terminal 64 and past the diode 31 to the terminal 65 on the switch 30. The current then goes through the switch 30 and comes out of the terminal 66 and returns through the return bus bar 70, which runs back towards the capacitor bank 60 as far as reasonable possible (between the bus bars 50, 55 and 75) to reduce the overall system inductance. In this configuration, the current coming out of the capacitor terminals 61, along the buses 50, 55, returns in a parallel path back towards the capacitors 61 in the bus bar 70. This close parallel path tends to cancel (or greatly reduce) the magnetic field generated by the passage of the current through the conducting buses both in magnitude and phase and, therefore, reducing overall system inductance.

When the switch 32 is turned off, the diode 31 is turned on and conducts current from the capacitor terminals 62 through the bus bar 75 to the terminal 67 of the diode 31, through the diode 31 and out of the diode 31 at the terminal 68 to the switch 30 via the bus bar 50. The current then goes through the switch 30 and out of the switch 30 at the terminal 66 back towards the capacitor bank 60 along the bus bar 70, creating again the close parallel current path that minimizes the bus inductance. It is the bus 70 which is used to carry the current to the motor (not shown) or whatever other device is being operated by the drive through a connection 69 to the bus. It is also noted that in this configuration, during both of the above cycles (whether the switch 32 is on or off), the inductance of the system will be very similar, as the return bus 70 is located in the middle of the two driving buses (50, 55 and 75, respectively), thus ensuring that the active buses are equidistant during operation.

It should be noted that it generally is preferred that the portions of the buses which are parallel to each other have no attachment holes or defects of any kind in the parallel portions of the buses to help optimize the bus performance.

The electrical connection between the buses and the electrical components (diode, capacitors, and switches) should be made via flanges 51–54, 56–59 of the buses. The flanges 51–54, 56–59 are preferred to be integral with parallel portion of the buses 50, 55, 70, 75 to optimize the transfer of the electrical current from the buses to the diode, transistors and capacitors. Moreover, it is preferred that the buses be secured to the capacitors, transistors and diodes at right angles. This configuration minimizes the amount of inductance generated by the buses at the contact points to the electrically live devices. Further, to keep inductance to a minimum, the flange angles where the buses are secured to the devices should be as sharp as possible. This will ensure that the parallel portions of the buses stay as close to each other as possible as they approach the connections.

The bus bars 50, 55, 70, and 75 of the present invention are sandwiched on either side of an insulator 40 and 41. The insulators 40, 41 can be made from any non-conductive insulative material such as pressed mica, Teflon, polyester sheets, aramid fibers or sheets, and other, similar synthetic insulating materials. However, it is preferred to use a laminated mica for AC voltage bus bars because of its optimal characteristics regarding the prevention of partial discharge between the buses, while an aramid material, such as Nomex®, generally is preferred for the DC voltage bus bars.

With regard to the AC voltage bus bars 50, 55, 70 and 75 of the present invention, although in existing AC drives the thickness of an insulator can be as high as 2 inches to avoid problems from the Corona-effect (i.e. arcing) because of the novel aspects of the present invention (which will be discussed further below) the thickness of the insulators 40, 41 can be as low as 0.020 inches (but should be higher for higher ends of the medium voltage spectrum). The type of insulation material used will determine the thickness required for a given voltage level. For example, in a preferred embodiment of the present invention, the thickness generally is about 0.060 inches to provide added protection and longevity. This reduced thickness greatly reduces the inductance between the parallel bus bars and, in the preferred embodiment, a 30 nano Henry per meter inductance is achieved with a 4 inch wide by ⅛ inch thick aluminum bus bar with 0.060 inch thick mica insulator in between bus bars. Because the inductance of two flat bus bars with opposing fields is directly related to the distance of space between the bars, the use of a very thin insulator creates a significant reduction in overall inductance, and allows for a significant reduction in the overall size of the AC drive.

Further, in current AC drives there is a need to have the insulator extend significantly beyond the edges of the bus bars to maximize the insulation between the bus bars because they are exposed to the air. Because of the novel configuration of the present invention, which will become more evident in the following discussion, it is not necessary to have the insulator extend significantly beyond the edges of the bus bars. It should be noted, however, that it is preferred that the insulators 40, 41 extend at least some distance from the edge of the bars to provide adequate protection and added damage tolerance characteristics. Having the insulators 40, 41 extending further than is required ensures that field or on-site repairs of the insulator are non-critical, thus not requiring replacement of the entire insulator if a small edge portion is broken or removed.

Figure 6A:
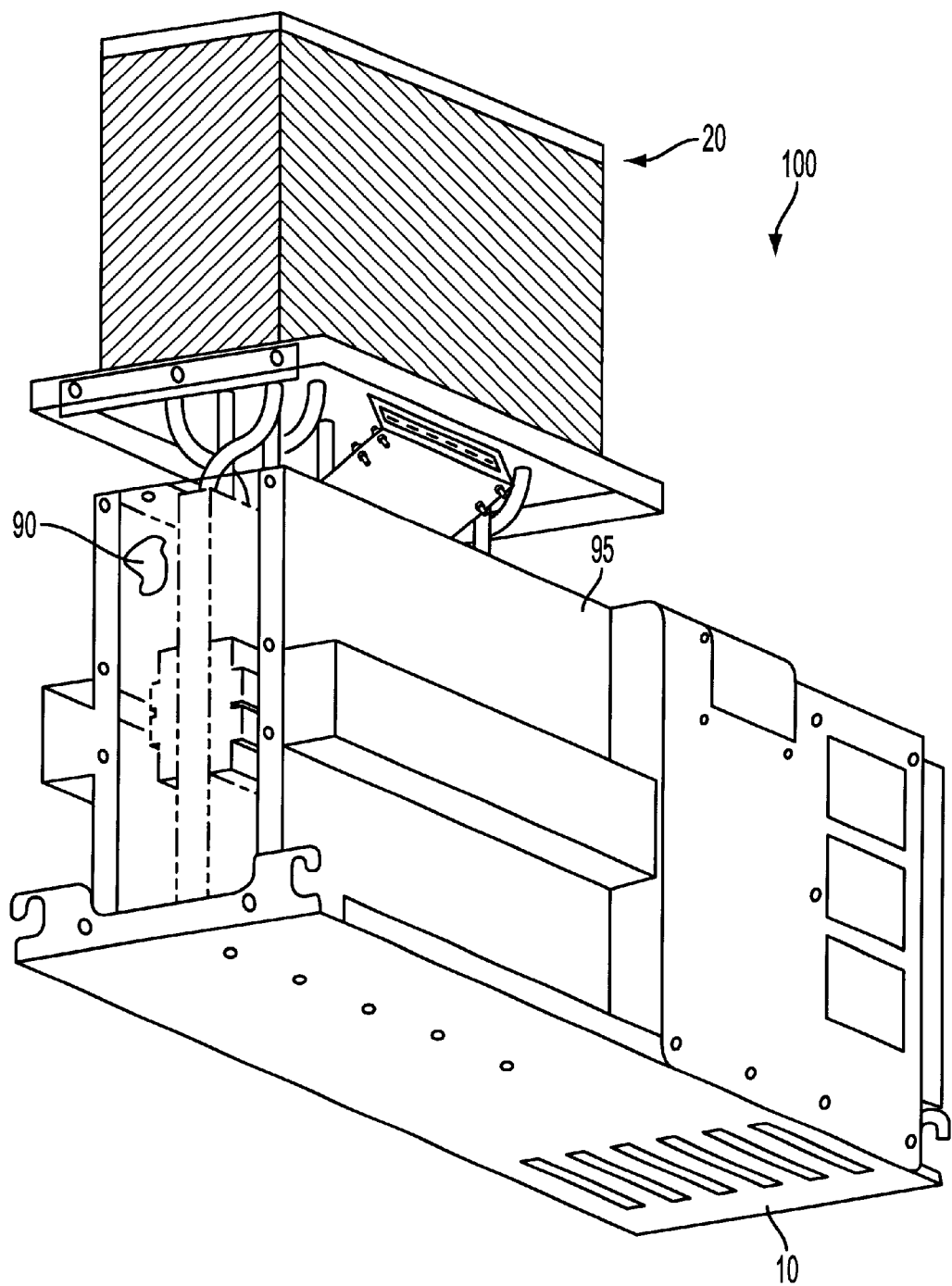
FIGS. 6A, 6B, and 6C show a diagrammatical representation of an exemplary embodiment of an inverter assembly in accordance with the present invention.
Figure 6B:
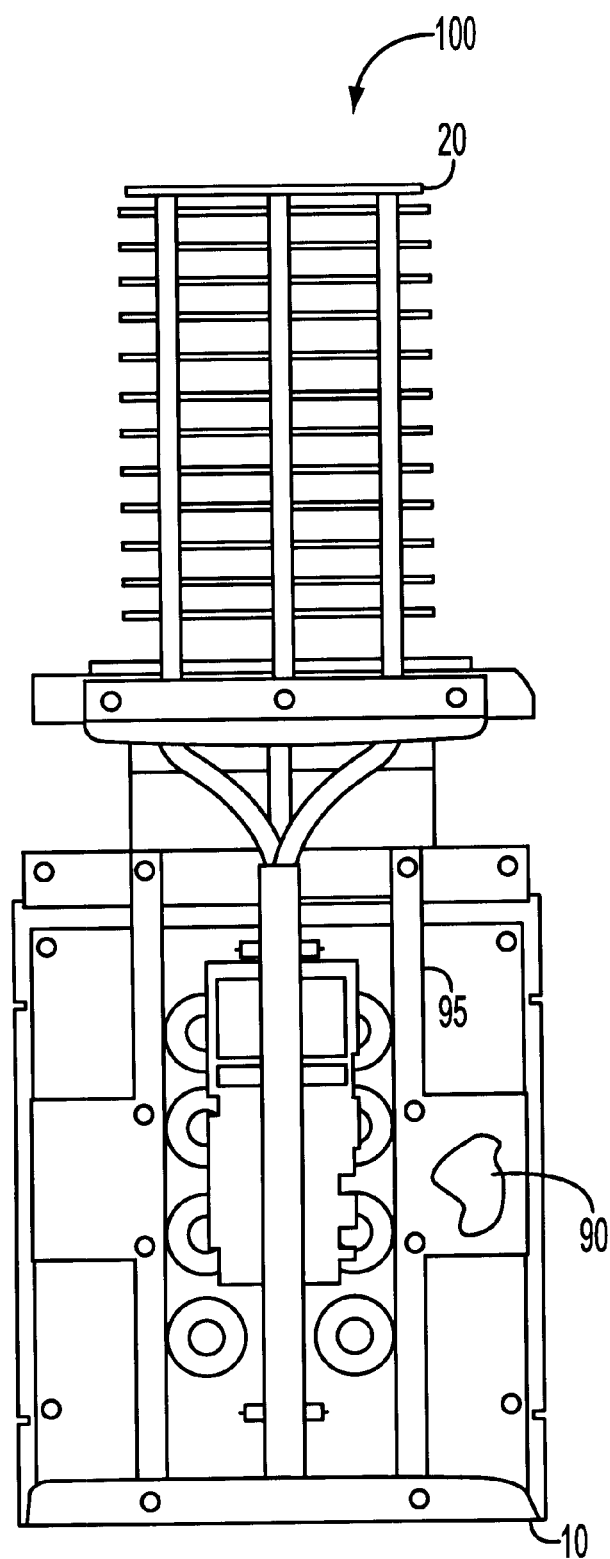
Figure 6C:
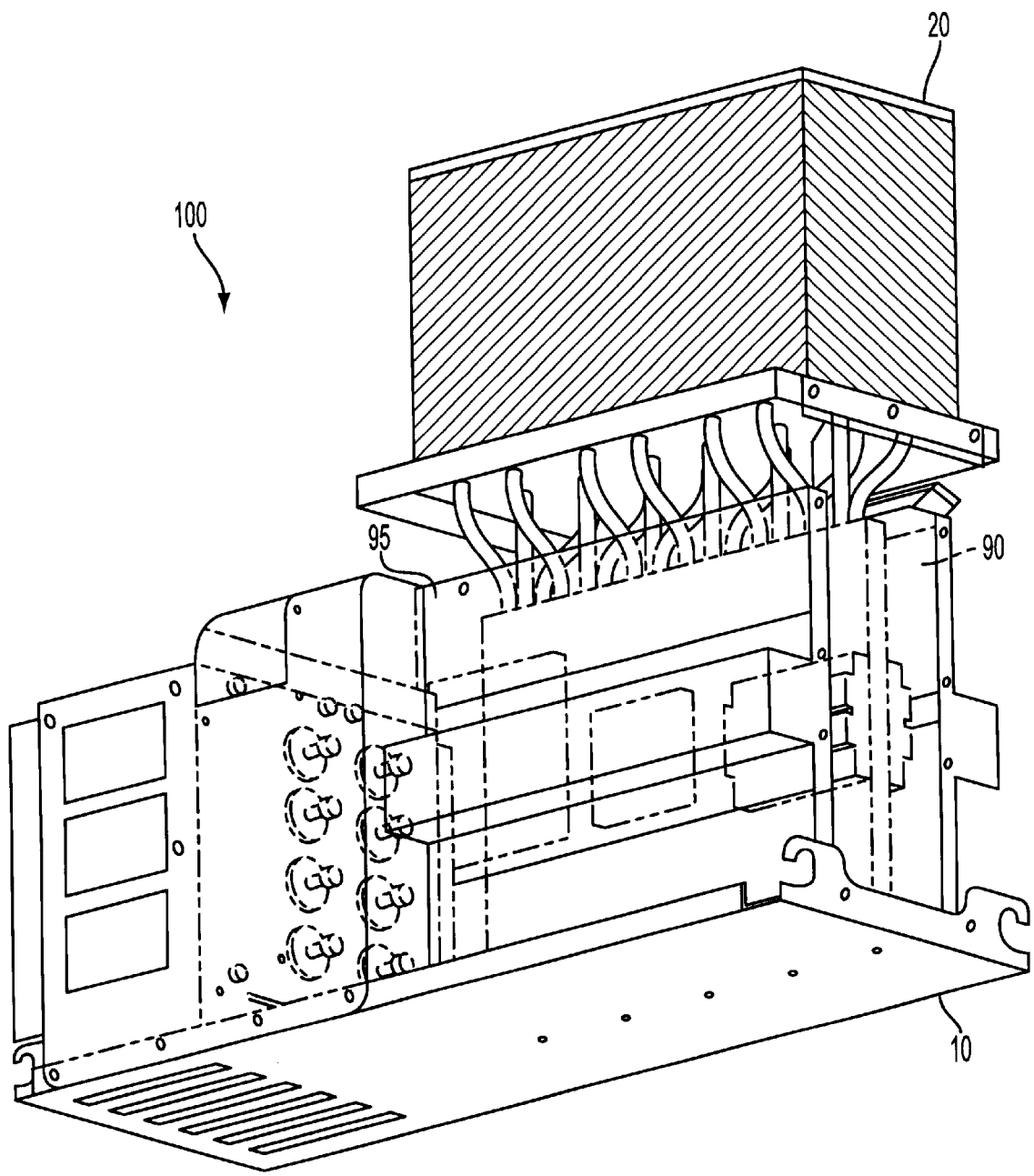

Turning now to FIGS. 6A, 6B, and 6C a substantially completed inverter 100 according to the present invention is shown. In these Figures, it can be seen that the electrically live components of the inverter 100 are sealed off from the outside atmosphere, by an insulative material 90 and a protective housing 95. The insulative material 90 typically covers all, or substantially all, of the electrically active devices (i.e. switches, diode, capacitor connections, and bus bars) so as to seal out the harmful atmosphere or air. Although any non-conductive insulative material can be used, such as a non-conductive gas, oil, or gel, it generally is preferred that a potting compound be used.

The potting compound 90 can be any known or commonly used non-conductive insulator, but is preferably a RTV silicone based compound. It is also preferred that the compound have at least some of the following physical characteristics:

Viscosity of resin as poured—20,000 cps,

Hardness, Shore A—28,

Tensile Strength—1,014 psi,

Elongation at break—600%,

Tear resistance 170 lbs/inch, and

Linear shrinkage—less than 1%.

An example of such an insulator that can be used is Elastocil® M4601, made by Wacker Chemie GmbH for its excellent reparability characteristics. Any other silicone based compound having similar or equivalent characteristics would also be desirable. The use of the potting compound 90 around the above components, prevents all, or almost all, of the air or other harmful gases, that these components would normally be exposed to, from contacting these components. This removal of the air or gases prevents them from acting as a conductor, and as such prevents corona-effect and partial discharge from occurring. Because of this all of the electrically active components can be placed very close to each other, whereas in the prior art they would have to be kept at a relatively large distance from each other, thus increasing the size of the drive.

The insulator 90 is sprayed, poured or otherwise applied, using known processes, over and about the components in such a manner as to substantially penetrate all, or almost all of the air pockets and gaps in and/or around the electrically active devices. The presence of any substantial amount of air or atmosphere would allow occurrence of the adverse effects related to having high voltage devices close to each other to which this invention is directed to greatly reduce or eliminate. Another beneficial aspect of the above compound 90, and its equivalents, is its removability from the electrical components when repairs are needed, since after curing the silicone insulator compound may turn from liquid to a consistency like a gel with varied amount of firmness. It is desirable to have as little adhesion as possible between the compound 90 and the components when removing the compound for repairs. This will reduce repair time and costs.

It should also be noted that the preferred silicone compounds are not susceptible to many of the problems which can occur in medium voltage AC drives. For example, silicone compounds are resistant to high voltage transients and the stresses that come with them, magnetic forces, temperature variations and levels, and high voltage dielectric stress without fatigue or failure. Moreover, the silicone compound maintains its integrity in any environmental condition, regardless of altitude, temperature, humidity, air quality, etc. Also, because air is removed from contacting the electrical components, there is no need to condition or filter the air to prevent any adverse effects of the air contacting the buses and other components. Current AC drives are cooled by passing air over the exposed electrical components, thus requiring substantial filtering and environmental controls for the cooling system. This makes using current drives in some harsh applications prohibitive.

Additionally, the potting compound 90 transfers and absorbs heat as well as, or even better, than air, thus allowing for heat transfer from the buses and other electrical components into the compound, which is then either transferred into the evaporator plate 22 of the heat sink assembly 20 or emitted through the surface of the potting compound 90 itself to the enclosure 95 and then to the air. Therefore, there is no loss in the thermal management characteristics of the AC drive. As shown in FIGS. 6A–6C, the potting compound 90 fills a significant portion of the space of the inverter 100 where the buses 50, 55, 70, and 75 contact the diode 31, the transistors 30, 32 and capacitors 61, 62. In fact, although it may not be necessary, it is preferred that the potting compound 90 at least cover all of these components so that air is prevented from contacting these components. When the compound is used to cover the capacitors 61, 62 terminals the height of these terminals can be reduced, thus allowing the capacitors to have lower internal inductance. However, if the compound 90 is not used to cover these contact points, then the manufacturer requirements for clearances of the capacitors 61, 62 should be maintained.

The potting compound 90 typically is applied so as to cover almost the entire surface of the evaporator plate 22 to provide the maximum thermal transfer surface possible between the compound 90 and the heat exchange assembly 20. Additionally, it is preferred that the potting compound 90 be installed on the inverter 100 as a single piece, and not in sections to ensure its integrity, and that the compound 90 have a thickness such that minor damage would not compromise its protective characteristics. In addition to providing adequate protection, the use of a thicker coating of compound will allow the compound to provide mechanical support for the busses 50, 55, 70, and 75 dampening mechanical vibrations and thus eliminating the need for many additional structural components which exist in current AC drives to hold the buses into place.

The exact configuration and outside dimensions of the compound 90 can be varied depending on the configuration and characteristics of the drive and components used. In the embodiment shown in FIGS. 6A through 6C the compound 90 generally has a thickness of at least 1 inch surrounding all of the covered high voltage components to allow operating voltages of up to 4,160 VAC RMS. The thickness should be optimized primarily for the amount of voltage being applied, as well as space, cost and weight considerations. To aid in reducing the cost of the compound 90 it is further contemplated that a dielectric filler (such as pellets or other shapes) can be used in the compound 90 to reduce the overall amount of volume of the compound used without compromising its beneficial characteristics. Although the compound 90 is shown in the Figures as somewhat following the contour of the components and the buses (there is a bulge where the buses are located) a solid block can be used having flat sides. Such a configuration may be desirable for applications where added protection of the silicone would be needed such as higher voltages than 15,000V. In FIGS. 1C, 2B, 3A–3C, and 4A a dashed line is used to show an exemplary encasing of the compound 90 around the electrically live components with respect to the heat exchanger assemblies.

Also shown in FIGS. 6A–6C is a compound housing 95. The housing 95 is added to provide added protection for the components and the compound 90 and to aid the compound 90 in retaining its shape. In some applications, and with some compounds, it may not be necessary to use a housing 95, however, it is preferred. The housing 95 can be made from any known or commonly used material, such as plastic, metal, carbon composite, etc. However, it is preferred that the housing 95 be made from a material to provide added electrostatic and electromagnetic shielding for the internal components.

Further, the structural integrity of the housing 95 should be made to match the type of insulator or compound 90 used. The present invention contemplates using any electrically and environmentally insulative material to protect the electrical components and prevent the adverse effects of having air contact the high voltage electrical components (e.g. the corona effect). Examples include using pure gases such as nitrogen, oils, gels, silicone potting compounds, or even a vacuum. All of these insulation methods substantially remove air and/or seal out the atmosphere from the high voltage components and impregnating any open spaces in and around them, thus allowing them to be placed in close proximity to each other. When some of these, such as nitrogen, oils, or a vacuum are used, the housing 95 must be manufactured to be able to maintain the integrity of the insulation (for example, be able to maintain a vacuum). Because of the difficulty and costs involved in manufacturing such a housing it is preferred to use an insulator which does not require stringent containment requirements, such as compounds having the previously mentioned preferred material characteristics, which can maintain their own integrity.

With regard to the dielectric insulator compound 90 that is used, although a one part, two part, three part silicone, or similar insulator compound 90 can be used, it is preferred that the insulator compound 90 that is used be "de-gased" prior to its installation on the inverter 100. When compounds are mixed it often causes the introduction of air bubbles and gas into the mixture, if these air bubbles were to remain in the insulator compound 90 when it is placed on the inverter 100, the operation of the system would be adversely affected as the air would be making contact with the components and the buses, thus causing similar problems as with current AC drives.

Further, when the AC drive of the present invention is to be used for the higher voltage range of the medium voltage spectrum, it is preferred that the insulator compound 90 be "vacuumed" after its application. Essentially this process entails applying the insulator compound 90 to the inverter 100 (or any other component) and placing the entire component in a vacuum chamber of some kind, while the insulator compound 90 is still setting. Then while the insulator compound 90 is setting, the air pressure in the chamber is reduced, thus allowing any remaining air in the mixture, or remaining between the components and the insulator compound 90 to be removed from the insulator compound 90 and/or inverter. This will ensure that the adverse effects of air are avoided, thus greatly increasing the operational life and efficiency of the AC drive, and allowing the components of the inverter 100 to be placed closer together to reduce the inductance created, and thus reducing the overall size of the AC drive itself. It should also be noted that in applications where the AC drive will be operating in the lower voltage ranges, the process of "vacuuming" is not necessary as the electrical loads and forces are not as critical.

Additionally, it is preferred that the insulator compound 90 be applied to the inverter assembly 100 while the insulator compound 90 is still in liquid form. In liquid form, before it cures, the silicone compound has very low surface tension, and it allows the compound 90 to impregnate the insulator 40, and/or any other small gaps in and around the buses, thus removing the air existing in any gaps and replacing it with the insulator compound 90. In the preferred embodiment, this impregnation is enhanced with vacuuming of the entire inverter module 100 prior to it.

When manufacturing an inverter 100 (or any other comparable component) in accordance with the present invention it is preferred that first a clamping force of some kind is provided to sandwich the buses 50, 55, 70 and 75 and the insulators 40, 41 as tightly as possible, while maintaining a truly parallel relationship between the upper and lower buses. Once the bus assembly is completed, the assembly is installed into the inverter 100 and is tested to ensure that there are no voltage isolation problems. Air, gases, moisture, contaminants, etc. then generally are purged from the electric buses and components by using a heated vacuum chamber to purge all adverse contaminants from the components. Afterwards (or during the cleaning stage) the unit is potted with the insulator compound 90 as described and set forth above (depending on the compound and method used). The amount and size of the potting should be such to provide adequate protection from air and other harmful elements and to provide a level of thermal conductivity from the components' surfaces to the heat sink assembly 20, and through the external surface of the insulator compound 90 to the enclosure 95. Because the insulator compound is applied in liquid form, it is easier to get the insulator compound 90 into the small areas of the electrical components to eliminate all air or gas. For this purpose it generally is preferred that the insulator compound 90 used have a low surface tension when in its liquid form to allow the insulator compound to penetrate into all of the required spaces.

Alternatively, to create additional impregnation of the insulator compound 90 into the insulator 40, and other components, pressure can be added to the insulator compound 90 after it is vacuumed (through either mechanical pressure or atmospheric pressure), to force additional compound material into any remaining air pockets. The compound 90 can then be cured at ambient temperature or any temperature recommended for the particular compound used. Once this process is completed the component (for example, inverter 100) should be tested again. At this point all, or almost all, of the air has been removed from contacting the critical components, such as the buses which allows the buses to be placed very close to each other, thus reducing inductance, and thus allowing for a significant reduction in the overall size of the AC drive. Further, there is no concern that the air quality or atmospheric conditions in a particular location would adversely affect the AC drive, because no air makes contact with the high voltage components. This greatly reduces the costs of filtering and conditioning air, and allows the AC drive to be placed directly adjacent to the machines which they would control, without taking up too much space and without requiring significant electrical routing. Additionally, some components required in current AC drives, such snubbers, are no longer needed.

Figure 7A:
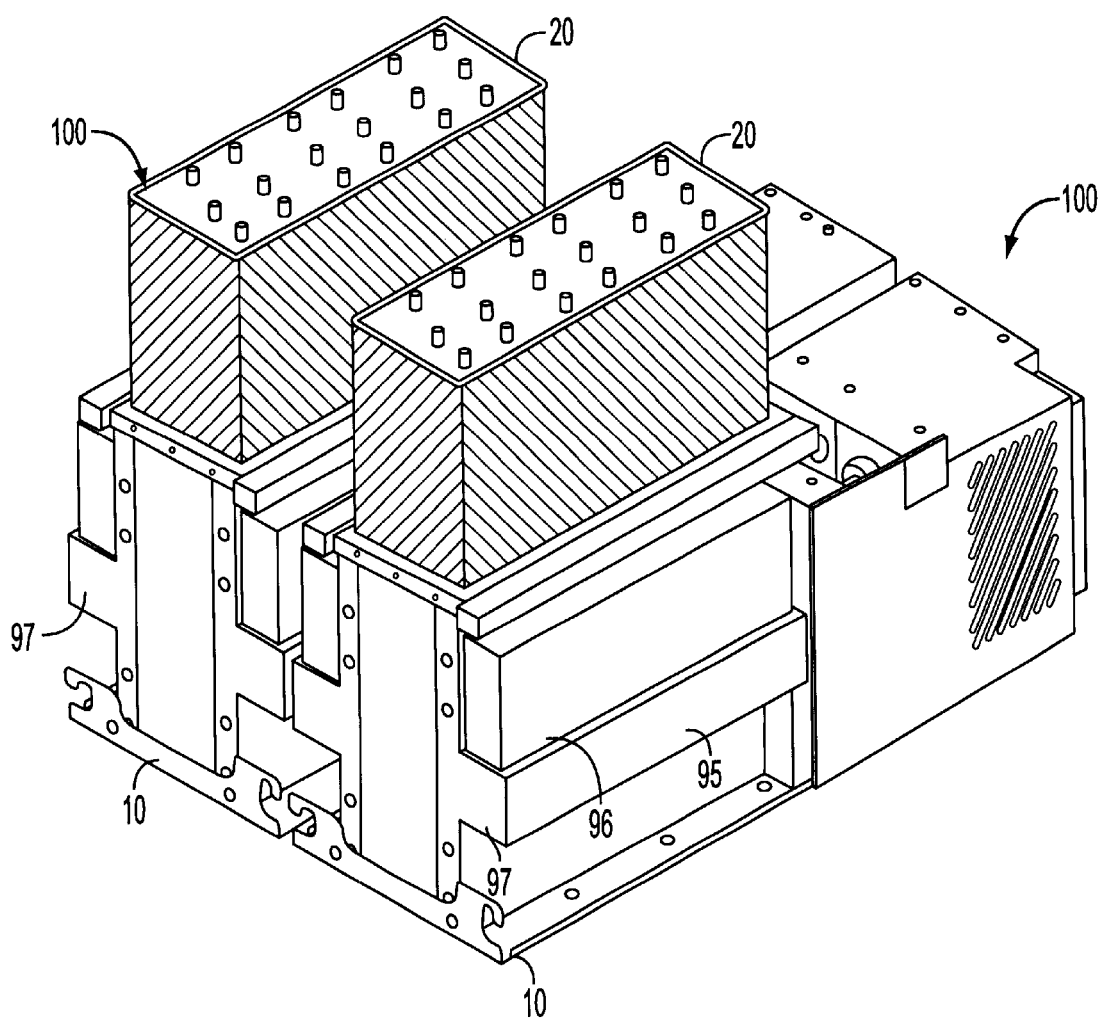
FIGS. 7A, 7B, and 7C show a diagrammatical representation of two inverter assemblies of FIGS. 6A, 6B, and 6C secured to each other.
Figure 7B:
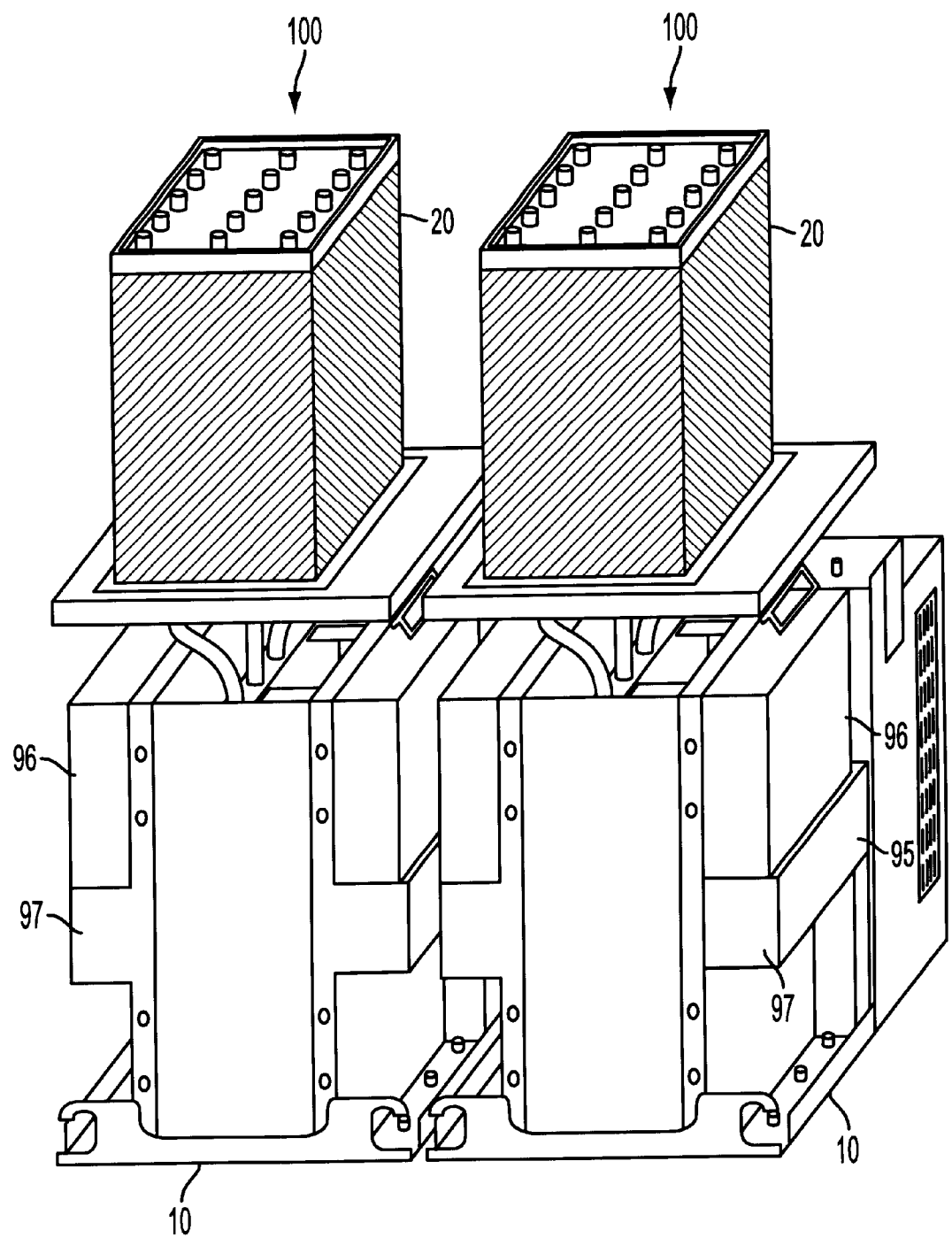
Figure 7C:
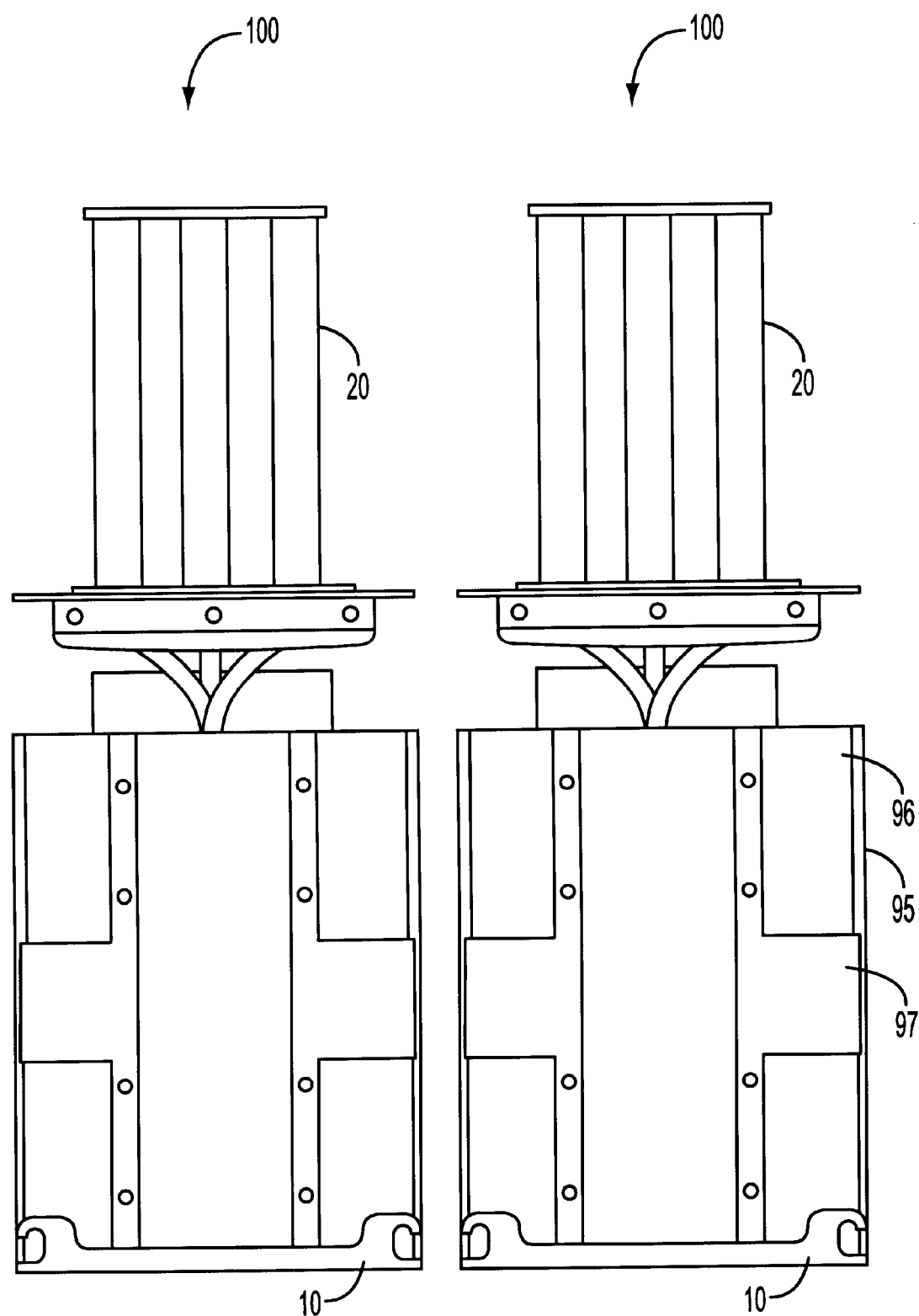

FIGS. 7A, 7B and 7C show two inverter modules 100 of the present invention secured to each as they would be in an exemplary embodiment of an AC drive according to the present invention. As stated previously, the trays 10 of the modules 100 are secured to each other by any commonly known or used method which would allow the easy removal of one module 100 from the other for repairs. Also shown in these Figures is a cosmic ray filtering device 96 mounted on the outside of the housing 95. As shown in these Figures, the potting compound or insulator 90 and the housing 95 are configured or applied in such a way as to effectively follow the contour of the components, thus providing the ledge portion 97 where the buses are located, and onto which the cosmic ray filter 96 can be positioned.

Cosmic ray effects on power semiconductor switches were discovered by accident, and are still not quite truly understood. Power conversion manufacturers discovered that their products were failing prematurely when using the power semiconductors within their voltage ratings. These power semiconductor switches would fail in a manner that indicated a semiconductor substrate insulation breakdown. The linking of such failures to cosmic rays arose because power conversion devices used underground, by about 300 feet, were not subject to the same failure rates. Further tests with energized power semiconductor switches bombarded by particle accelerators caused the same effect as the ones seen in products operating at the earth's surface. The solution presented by the semiconductor manufacturers was to de-rate the operating voltage of a power semiconductor switch such as the IGBT (Insulated Gate Bipolar Transistor) to about sixty percent of its rated voltage capability. The voltage limit is defined by statistical processes. Also, polyethylene has been used in manned spacecraft devices to protect equipment and humans from the effects of particles emitted by the sun in particular during the solar storms. These particles are larger in comparison to what is called cosmic rays.

Cosmic rays are high-energy subatomic particles that are emitted by celestial bodies. Some types of particles can pass through the whole cross section of the earth while others are dissipated when contacting with materials on and in the earth. This energy dissipation and subatomic recombination may cause adverse effects on biological (cells) and electrical systems (semiconductor devices).

The present invention includes a cosmic ray filter 96 that may be added to increase the semiconductor voltage utilization. For containing these particles, or greatly inhibiting their adverse effects on the electrical systems of the present invention, it is preferred that the filter 96 be made of lead or similar material, which covers the power semiconductor switches such as IGBT. The electrostatic and electromagnetic shielding container or housing 95 is designed to closely surround the power semiconductor switches, and create a ledge 97 where a polyethylene-coated lead block is inserted to absorb large and small subatomic particles from cosmic rays. In the preferred embodiment of the present invention, the cross section of the lead block is at least two inches thick and the polyethylene coat is at least half inch thick filling the space above the ledge 97. In reality, the use of any amount of material such as lead will reduce the effects of cosmic rays, by filtering, and the two inch thick minimum is based on experimentation to achieve adequate power semiconductor life when increasing the applied voltage or increasing its life expectancy when used with manufacturer recommended operating voltage.

It should be noted that the positioning of the filters 96 shown in these Figures assumes that the AC drive assembly will lay on its mounting surface (floor) as shown, thus not needing filter 96 protection on the bottom sides of the ledges 97 (as harmful cosmic rays come from the sky and not through the earth). However, it is possible to have the AC drive sit upright (on its side). In this case, the filters 96 would be located on either side of the ledge 97, on the top side of the housing 95, to provide adequate protection for the internal components of the drive. Alternatively the filters 96 can be encapsulated in the potting compound prior to the compound 90 curing.

With the present invention, small volume power conversion devices such as the inverters 100 are created allowing the use of a reasonably sized block of polyethylene clad lead, that fits in the opening between inverter modules 100, to protect the power semiconductor switches from the effects of cosmic rays and moreover allowing the applied voltage to be higher than the recommended sixty percent to about seventy five percent of the switch's rated voltage. For example, with current AC drive configurations a 3,300V IGBT cannot operate over 1,900V on the earth surface level. With the present invention the operating voltage could be raised to 2,500V, for example.

Figure 8:
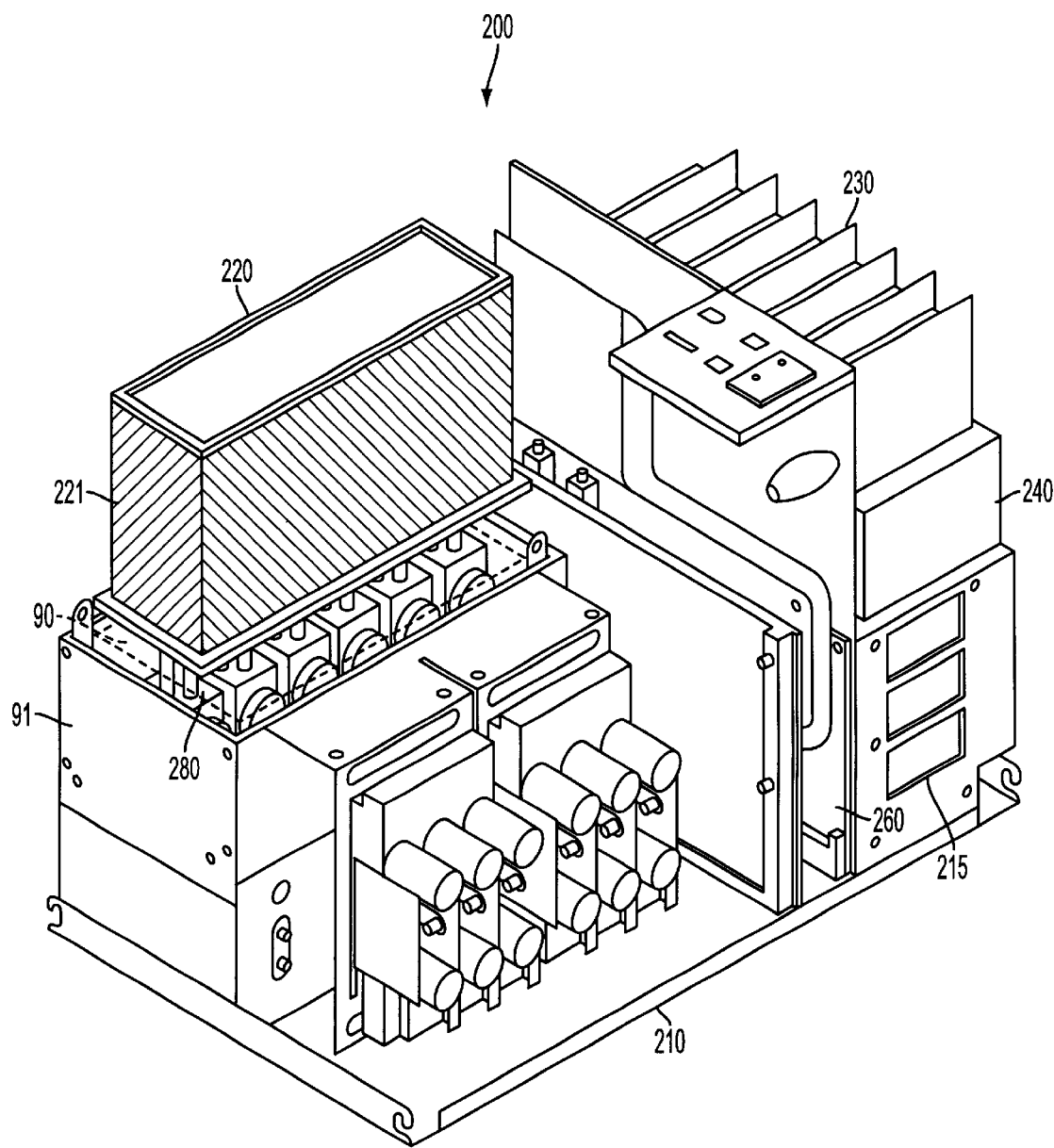
FIG. 8 is a diagrammatical representation of an exemplary embodiment of a converter assembly used with the present invention.
Figure 9:
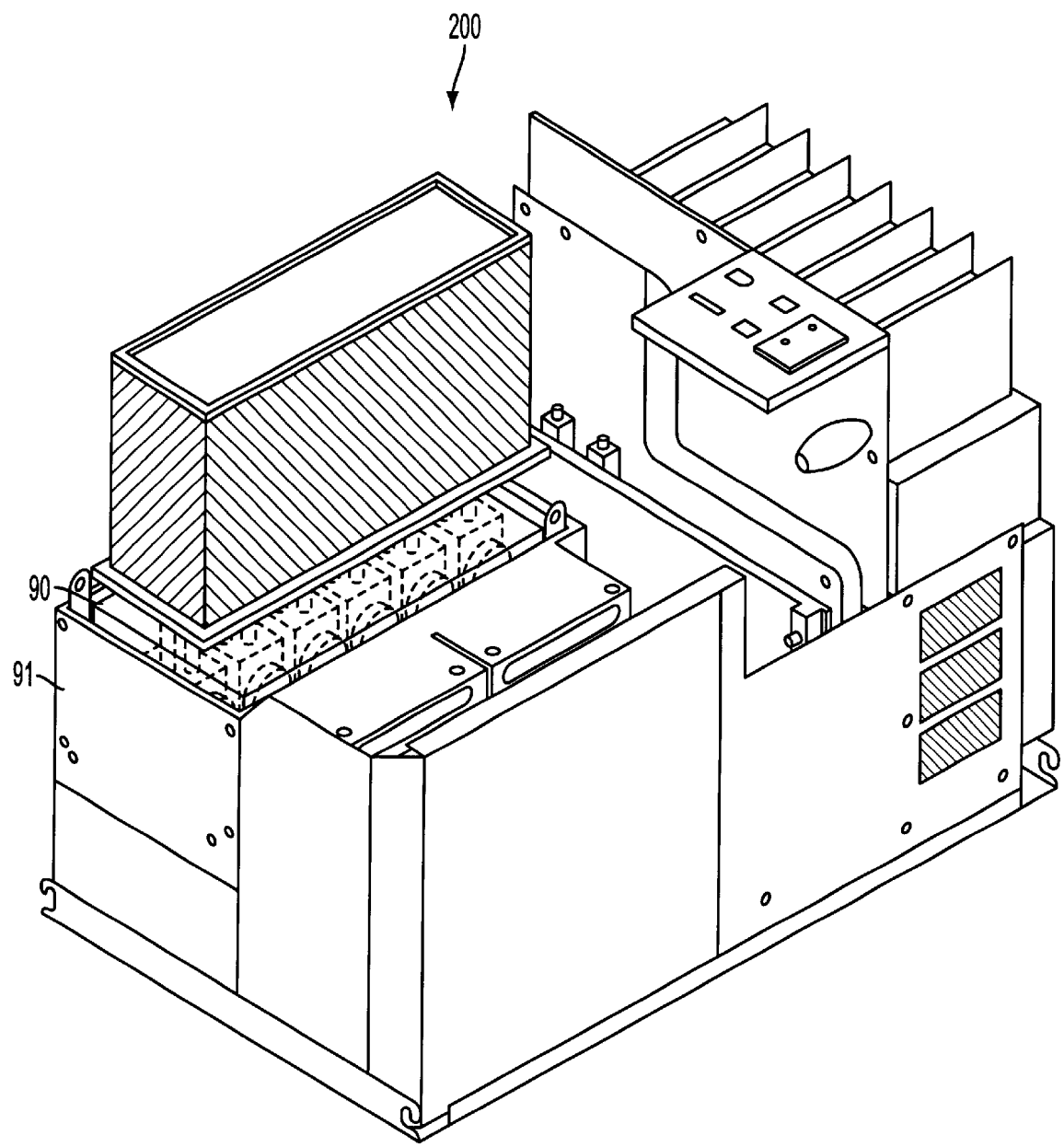
FIG. 9 is another diagrammatical representation of the converter assembly shown in FIG. 8.

FIGS. 8 and 9 show a converter assembly 200 which is to be used in an AC drive of the present invention. The converter 200 is used for converting an incoming AC voltage into a DC voltage so it can be manipulated and converted back to a variable amplitude and variable frequency AC voltage in the inverters 100. The manufacture of the converter 200 is similar to that of the manufacture of the inverter 100, as previously discussed. The converter 200 generally includes a modular base 210 having a capacitor bracket assembly 215, which is similar in construction to the base 10 and capacitor bracket 15 of the inverter 100. The base 210 typically made from the same materials as the base 10, and is to be able to easily connected to or disconnected from the inverter base 10. This ensures the modular aspects of the present invention, thus allowing various portions of the AC drive to be removed or installed easily without significant cost or loss of operating time.

The converter 200 also includes a capacitor bank 260, similar to that in the inverter 100. Additionally, the converter 200 includes a reactor 280, a high voltage sub-assembly 240, and a connector sub-assembly 230.

Further, much like the inverter 100, discussed above, the converter 200 has a heat exchanger assembly 220. The heat exchanger assembly 220 shown in these Figures is similar to that shown in FIGS. 3A–3C, but can any of the previously discussed configurations, depending on the desired cooling method, and electrical components used.

It should be noted that an AC drive according to the present invention generally will use modular components (for example, inverters 100 and converters 200) which have compatible or similar heat exchange systems. This will allow for easy replacement and repair of inverter/converter modules, by allowing a replacement to be quickly inserted to replace a removed component. Further, it is contemplated that different heat exchange systems can be used for different modules in a single AC drive assembly. When this configuration is used it is preferable that the overall size and shape of the heat exchanger assemblies be similar so as to maintain the compact and accessible aspects of the present invention.

As with the inverters 100, the converter 200 is to have potting compound 90 cover any and all high voltage components on the heat exchanger system and on the capacitor bank connections. As shown in FIGS. 8 and 9 the container 91, in which the heat exchanger assembly 220 sits is substantially filed with insulator compound 90 to provide the necessary protections provided by the using of the insulation 90. Typically the same process as described for the inverter 100 is utilized to apply the insulator compound 90. That is to eliminate dirt, contaminants, moisture and air in a heated vacuum chamber and applying the insulator compound 90 in liquid form during or prior to this process. The insulator compound 90 is typically applied to cover all of the high voltage components and bus bars. It is noted that the methods of insulation previously discussed with regard to the inverter assemblies 100 equally apply to the converter assembly 200. Additionally, the cosmic filter 96 of FIG. 7B could also be applied in this case to protect the high voltage semiconductor components of the converter 200.

Figure 10:
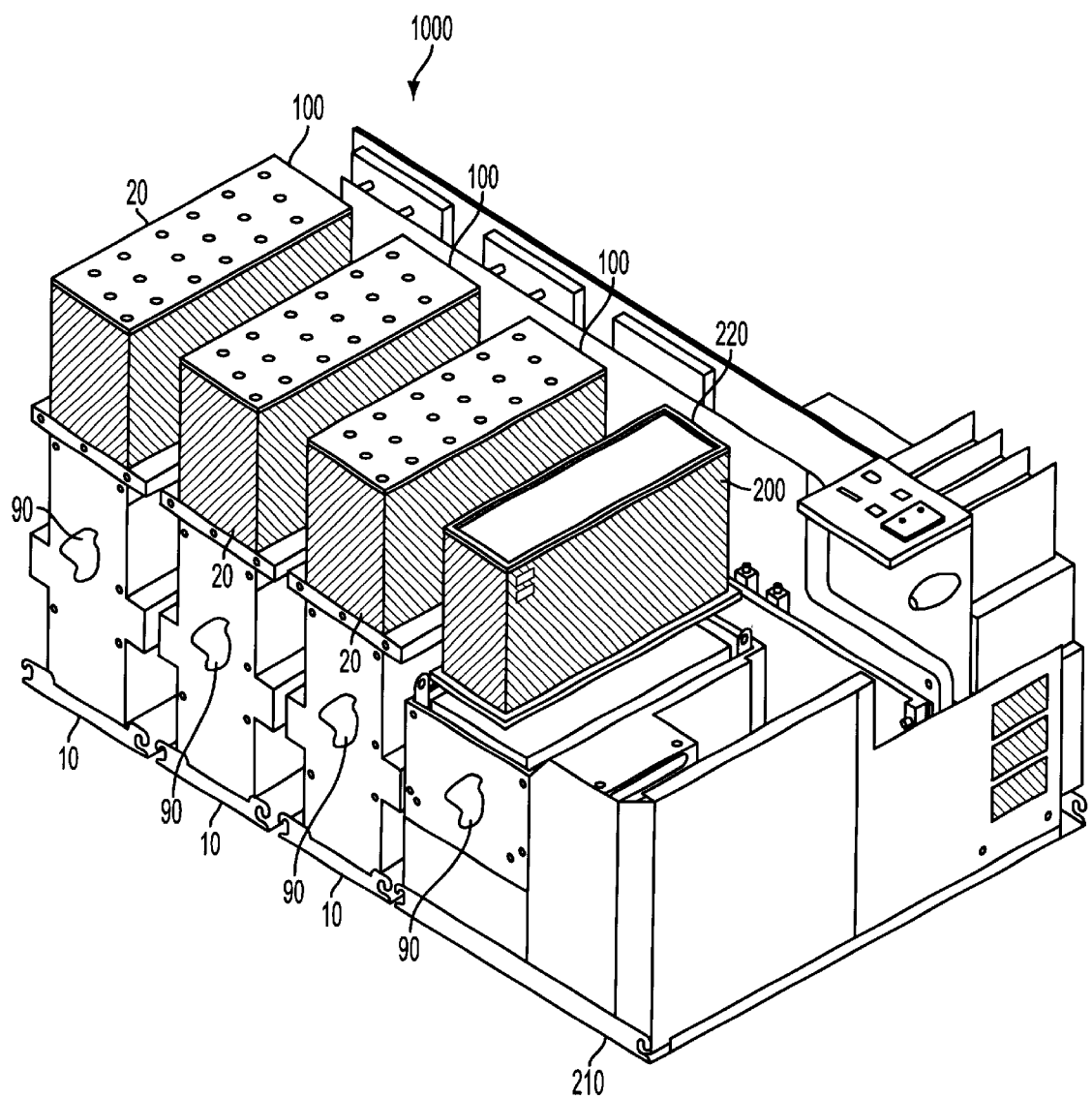
FIG. 10 is a diagrammatical representation of an exemplary embodiment of an AC microdrive assembly in accordance with the present invention.
Figure 11:
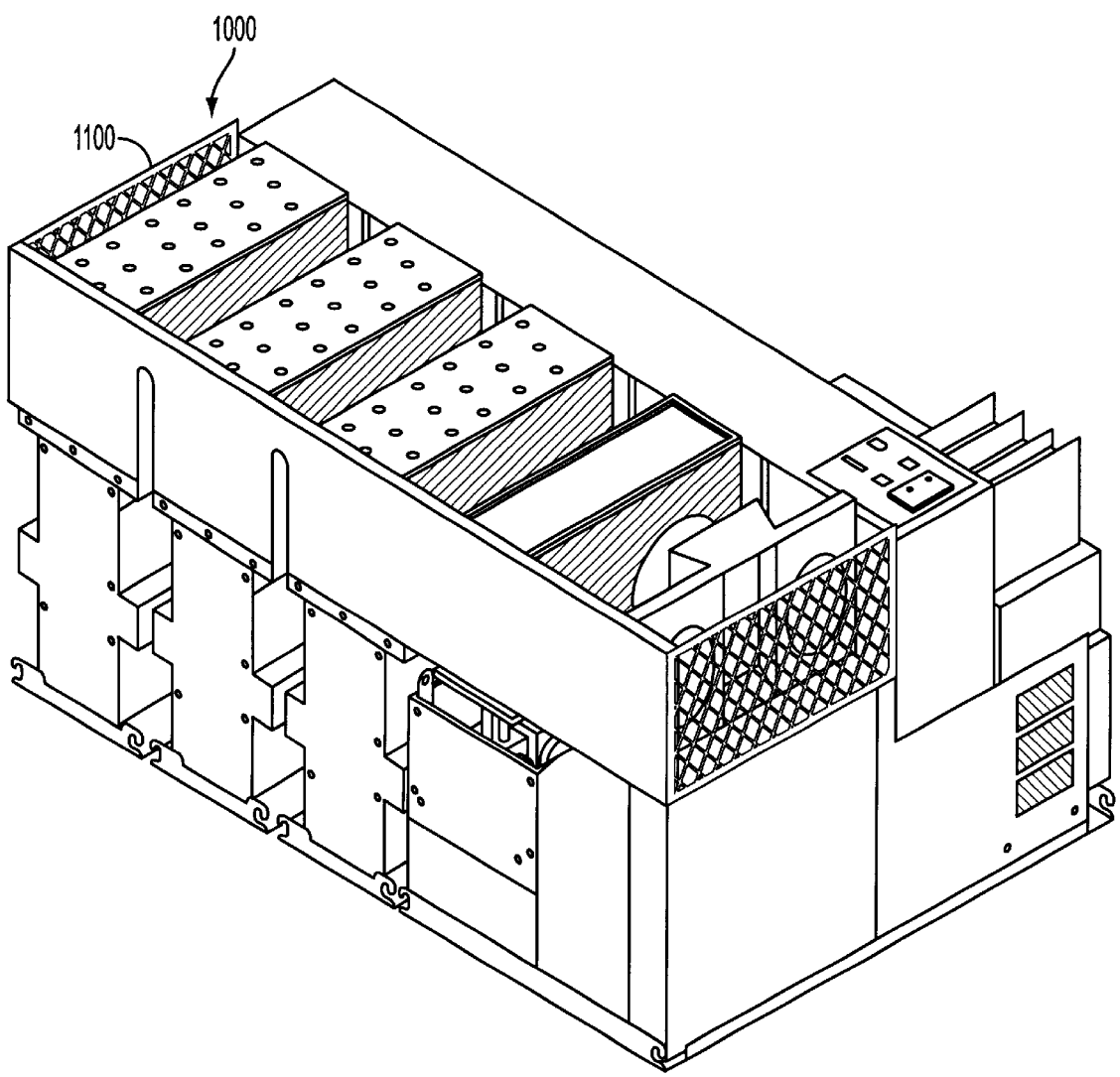
FIG. 11 is a diagrammatical representation of the AC microdrive assembly shown in FIG. 10 with an exemplary cooling system installed.

FIGS. 10 and 11 show an assembled AC drive 1000 according to the present invention, where there are three inverters 100, and a single converter 200, and a common cooling system, 1100. As noted previously, and as can be seen in these Figures, the modular aspect of the present invention provides the advantage that a single inverter 100 can be easily removed and replaced in the AC drive assembly 1000 without significant cost or down time, even though the elements of this invention could be used on a non-modular ac drive in such a way that all of the high-voltage components and bus bars of the three inverter modules and converter module would be inside one single enclosure. Further, it is noted that because of the fact that air is not used to cool the buses and electrical components of the drive 1000 almost any commonly known or used cooling system 1100 may be used. A forced air-duct cooling system 1100 is depicted in FIG. 11, however it is noted that other cooling mediums such as oil and water can be used. If oil (or any other liquid is used) is used, the oil (or liquid) should not chemically attack and degrade the insulator compound 90 used to seal the electrical components in case some of it drips on top of the enclosure 95.

Moreover, because of the benefits of the use of the insulator compound to eliminate the exposure to air of the high-voltage components, no elaborate environmental control or filtering system is needed to control the quality of the air used to cool the AC drive. As the high-voltage components are air tight, air flow which contains a significant amount of contaminants such as coal dust (as an example) could pass through the condenser blocks without adversely affecting the operation of the drive.

It is of course understood that variations, modification, and departures can be made from the preferred embodiments of the invention by those of ordinary skill in the art without departing from the spirit and scope of the invention that is limited only by the following claims.

We claim:

1. A medium voltage AC drive, said drive comprising:
   a converter, and
   at least one inverter, wherein said at least one inverter comprises:
   a heat exchanger,
   at least one transistor thermally coupled to said heat exchanger,
   at least one capacitor,
   a plurality of electrical buses electrically coupling said transistor to said capacitor at contact points respectively located on said transistor and said capacitor, and
   an insulation applied to at least one of said electrical buses, covering all of said contact points between said at least one of said electrical buses and said transistor such that said at least one of said electrical buses and said contact points between said transistors and said bus are substantially sealed from atmosphere.

2. The AC drive of claim 1, wherein said electrical buses are aluminum.

3. The AC drive of claim 1, wherein at least two of said electrical buses are in a substantially parallel relationship with each other and have an insulator positioned therebetween.

4. The AC drive of claim 3, wherein each of said parallel buses has flanges extending therefrom to electrically couple said buses to said transistors.

5. The AC drive of claim 4, wherein each of said parallel buses is connected to said transistor such that said parallel buses are at right angles to said transistor.

6. The AC drive of claim 3, wherein said insulator is laminated mica.

7. The AC drive of claim 3, wherein said insulation impregnates at least some of a surface of said insulator so as to remove air from said at least some of said surface.

8. The AC drive of claim 1, wherein said insulation is silicone based.

9. The AC drive of claim 1, wherein said insulation is a RTV silicone.

10. The Ac drive of claim 1, wherein said insulation has a Shore A hardness of approximately 28.

11. The AC drive of claim 1, wherein said insulation covers all of said buses and all of said contact points between said electrical buses and said transistors such that all of said buses and all of said contact points between said buses and said transistors are substantially sealed from said atmosphere.

12. The AC drive of claim 1, wherein said heat exchanger comprises a planar member to which said transistors are thermally coupled, and wherein said insulation covers substantially all of said planar member.

13. The AC drive of claim 1, wherein said insulation is in a de-gased state.

14. The AC drive of claim 1, further comprising a cooling system passing a cooling medium past said heat exchanger.

15. The AC drive of claim 14, wherein said cooling medium is air.

16. The AC drive of claim 1, wherein said insulation covers all of said buses and all of said contact points such that all of said buses and all of said contact points are substantially sealed from said atmosphere.

17. An inverter assembly for use in an AC drive, said inverter comprising:

a heat exchanger, a plurality of transistors thermally coupled to said heat exchanger, a plurality of capacitors, and a plurality of electrical buses electrically coupling said transistors to said capacitors at contact points respectively located on each of said transistors and said capacitors, wherein substantially all of said electrical buses and all of said contact points between said electrical buses and said transistors are covered with an insulation such that said substantially all of said electrical buses and said contact points between said transistors and said buses are substantially sealed from an atmosphere.

18. The inverter of claim 17, wherein said electrical buses are aluminum.

19. The inverter of claim 17, wherein at least two of said electrical buses are in a substantially parallel relationship with each other and have an insulator positioned therebetween.

20. The inverter of claim 19, wherein each of said parallel buses has flanges extending therefrom to electrically couple said buses to said transistors.

21. The inverter of claim 20, wherein each of said parallel buses is connected to said transistors such that said parallel buses are at right angles to said transistors.

22. The inverter of claim 19, wherein said insulator is laminated mica.

23. The inverter of claim 19, wherein said insulation impregnates at least some of a surface of said insulator so as to remove air from said at least some of said surface.

24. The inverter of claim 17, wherein said insulation is silicone based.

25. The inverter of claim 17, wherein said insulation is a RTV silicone.

26. The inverter of claim 17, wherein said insulation has a Shore A hardness of approximately 28.

27. The inverter of claim 17, wherein said insulation covers all of said buses and all of said contact points between said electrical buses and said transistors such that all of said buses and all of said contact points between said buses and said transistors are substantially sealed from said atmosphere.

28. The inverter of claim 17, wherein said heat exchanger comprises an evaporator plate to which said transistors are thermally coupled, and wherein said insulation covers substantially all of said evaporator plate.

29. The inverter of claim 17, wherein said insulation is in a de-gased state.

30. The inverter of claim 17, wherein said insulation covers all of said buses and all of said contact points such that all of said buses and all of said contact points are substantially sealed from said atmosphere.

31. The AC drive of claim 1, wherein the insulation contains a filler material.

32. The AC drive of claim 31, wherein the filler material is a dielectric material.

33. The AC drive of claim 11, wherein the insulation contains a filler material.

34. The AC drive of claim 33, wherein the filler material is a dielectric material.

35. The AC drive of claim 16, wherein the insulation contains a filler material.

36. The AC drive of claim 35, wherein the filler material is a dielectric material.

37. The AC drive of claim 17, wherein the insulation contains a filler material.

38. The AC drive of claim 37, wherein the filler material is a dielectric material.

39. The AC drive of claim 27, wherein the insulation contains a filler material.

40. The AC drive of claim 39, wherein the filler material is a dielectric material.

41. The AC drive of claim 30, wherein the insulation contains a filler material.

42. The AC drive of claim 41, wherein the filler material is a dielectric material.

* * * * *